(12) United States Patent
Murukesan et al.

(10) Patent No.: US 11,862,675 B2
(45) Date of Patent: *Jan. 2, 2024

(54) HIGH VOLTAGE METAL-OXIDE-SEMICONDUCTOR (HVMOS) DEVICE INTEGRATED WITH A HIGH VOLTAGE JUNCTION TERMINATION (HVJT) DEVICE

(71) Applicant: Taiwan Semiconductor Manufacturing Company, Ltd., Hsin-Chu (TW)

(72) Inventors: Karthick Murukesan, Hsinchu (TW); Wen-Chih Chiang, Hsinchu (TW); Chun Lin Tsai, Hsin-Chu (TW); Ker-Hsiao Huo, Zhubei (TW); Kuo-Ming Wu, Hsinchu (TW); Po-Chih Chen, Hsinchu (TW); Ru-Yi Su, Kouhu Township (TW); Shiuan-Jeng Lin, Hsinchu (TW); Yi-Min Chen, Hsinchu (TW); Hung-Chou Lin, Douliu (TW); Yi-Cheng Chiu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 14 days.

This patent is subject to a terminal disclaimer.

(21) Appl. No.: 17/462,403

(22) Filed: Aug. 31, 2021

(65) Prior Publication Data

US 2021/0399087 A1    Dec. 23, 2021

Related U.S. Application Data

(63) Continuation of application No. 16/601,998, filed on Oct. 15, 2019, now Pat. No. 11,145,713, which is a
(Continued)

(51) Int. Cl.
*H01L 29/06* (2006.01)
*H01L 21/8234* (2006.01)
(Continued)

(52) U.S. Cl.
CPC .... *H01L 29/063* (2013.01); *H01L 21/823481* (2013.01); *H01L 21/823493* (2013.01);
(Continued)

(58) Field of Classification Search
CPC ... H01L 29/063–0634; H01L 29/66681; H01L 29/7816; H01L 29/7835;
(Continued)

(56) References Cited

U.S. PATENT DOCUMENTS 6,124,628 A    9/2000  Fujihira et al.
8,143,699 B2   3/2012  Ching et al.
(Continued)

OTHER PUBLICATIONS

Triebl, O. "Reliability Issues in High-Voltage Semiconductor Devices." 2.2 Device Design Techniques. The publication date is unknown. Retrieved online on Jan. 8, 2018 from http://www.iue.tuwien.ac.at/phd/triebl/node9.html.
(Continued)

*Primary Examiner* — Eric K Ashbahian
(74) *Attorney, Agent, or Firm* — Eschweiler & Potashnik, LLC

(57) ABSTRACT

Various embodiments of the present application are directed towards an integrated circuit (IC) in which a high voltage metal-oxide-semiconductor (HVMOS) device is integrated with a high voltage junction termination (HVJT) device. In some embodiments, a first drift well and a second drift well are in a substrate. The first and second drift wells border in a ring-shaped pattern and have a first doping type. A peripheral well is in the substrate and has a second doping type opposite the first doping type. The peripheral well
(Continued)

surrounds and separates the first and second drift wells. A body well is in the substrate and has the second doping type. Further, the body well overlies the first drift well and is spaced from the peripheral well by the first drift well. A gate electrode overlies a junction between the first drift well and the body well.

20 Claims, 12 Drawing Sheets

Related U.S. Application Data continuation of application No. 15/964,636, filed on Apr. 27, 2018, now Pat. No. 10,535,730.

(60) Provisional application No. 62/564,695, filed on Sep. 28, 2017.

(51) Int. Cl.
| | |
|---|---|
| H01L 27/088 | (2006.01) |
| H01L 29/10 | (2006.01) |
| H01L 29/66 | (2006.01) |
| H01L 29/78 | (2006.01) |
| H03K 19/0185 | (2006.01) |
| H01L 21/8238 | (2006.01) |
| H01L 27/092 | (2006.01) |
| H01L 29/08 | (2006.01) |
| H01L 29/40 | (2006.01) |
| H01L 29/423 | (2006.01) |

(52) U.S. Cl.
CPC ........ *H01L 27/088* (2013.01); *H01L 29/0634* (2013.01); *H01L 29/1095* (2013.01); *H01L 29/66681* (2013.01); *H01L 29/7816* (2013.01); *H01L 29/7835* (2013.01); *H03K 19/018507* (2013.01); *H01L 21/823418* (2013.01); *H01L 21/823892* (2013.01); *H01L 27/0922* (2013.01); *H01L 29/0696* (2013.01); *H01L 29/0847* (2013.01); *H01L 29/0886* (2013.01); *H01L 29/404* (2013.01); *H01L 29/42368* (2013.01)

(58) Field of Classification Search
CPC ......... H01L 29/1095; H01L 21/823481; H01L 27/088; H03K 19/018507
See application file for complete search history.

(56) References Cited

U.S. PATENT DOCUMENTS

| | | | |
|---|---|---|---|
| 8,587,073 B2* | 11/2013 | Cheng | ............... H01L 29/66166 |
| | | | 257/E21.004 |
| 8,629,513 B2 | 1/2014 | Su et al. | |
| 8,680,616 B2 | 3/2014 | Su et al. | |
| 9,190,535 B2 | 11/2015 | Yeh et al. | |
| 9,680,009 B2 | 6/2017 | Murukesan et al. | |
| 10,535,730 B2 | 1/2020 | Murukesan et al. | |
| 11,145,713 B2* | 10/2021 | Murukesan | ......... H01L 29/0634 |
| 2006/0220168 A1 | 10/2006 | Hsing | |
| 2008/0074165 A1 | 3/2008 | Jeon et al. | |
| 2010/0052091 A1 | 3/2010 | Tanaka | |
| 2010/0109081 A1 | 5/2010 | Chen et al. | |
| 2010/0283116 A1 | 11/2010 | Shimizu | |
| 2012/0139041 A1 | 6/2012 | Su et al. | |
| 2013/0341718 A1 | 12/2013 | Kim et al. | |
| 2014/0024186 A1* | 1/2014 | Yoo | ................. H01L 21/823462 |
| | | | 257/E21.409 |
| 2015/0008539 A1* | 1/2015 | Kanda | ................. H01L 29/1095 |
| | | | 257/409 |
| 2015/0014783 A1* | 1/2015 | Imai | .................... H01L 27/1207 |
| | | | 257/372 |
| 2017/0271506 A1 | 9/2017 | Yamaji | |
| 2018/0033854 A1* | 2/2018 | Kaya | .................. H01L 29/7835 |
| 2018/0069076 A1 | 3/2018 | Tanaka et al. | |
| 2019/0131296 A1 | 5/2019 | Marukesan et al. | |

OTHER PUBLICATIONS

International Rectifier. "HV Floating MOS-Gate Driver ICs." Mar. 23, 2007.
Hwang, Jong-Tae. "How to Drive Switching Devices Without Losing Speed." EE Times, May 26, 2005.
Allen, P.E. "Lecture 140—The MOS Switch and Diode." Mar. 25, 2010.
Non-Final Office Action dated Dec. 10, 2018 for U.S. Appl. No. 15/964,636.
Final Office Action dated Jun. 21, 2019 for U.S. Appl. No. 15/964,636.
Notice of Allowance dated Aug. 20, 2019 for U.S. Appl. No. 15/964,636.
Notice of Allowance dated Feb. 4, 2020 for U.S. Appl. No. 16/128,578.
Notice of Allowance dated Oct. 30, 2020 for U.S. Appl. No. 16/662,496.
Non-Final Office Action dated Jul. 8, 2020 for U.S. Appl. No. 16/601,998.
Final Office Action dated Mar. 3, 2021 for U.S. Appl. No. 16/601,998.
Notice of Allowance dated Jun. 1, 2021 for U.S. Appl. No. 16/601,998.

* cited by examiner

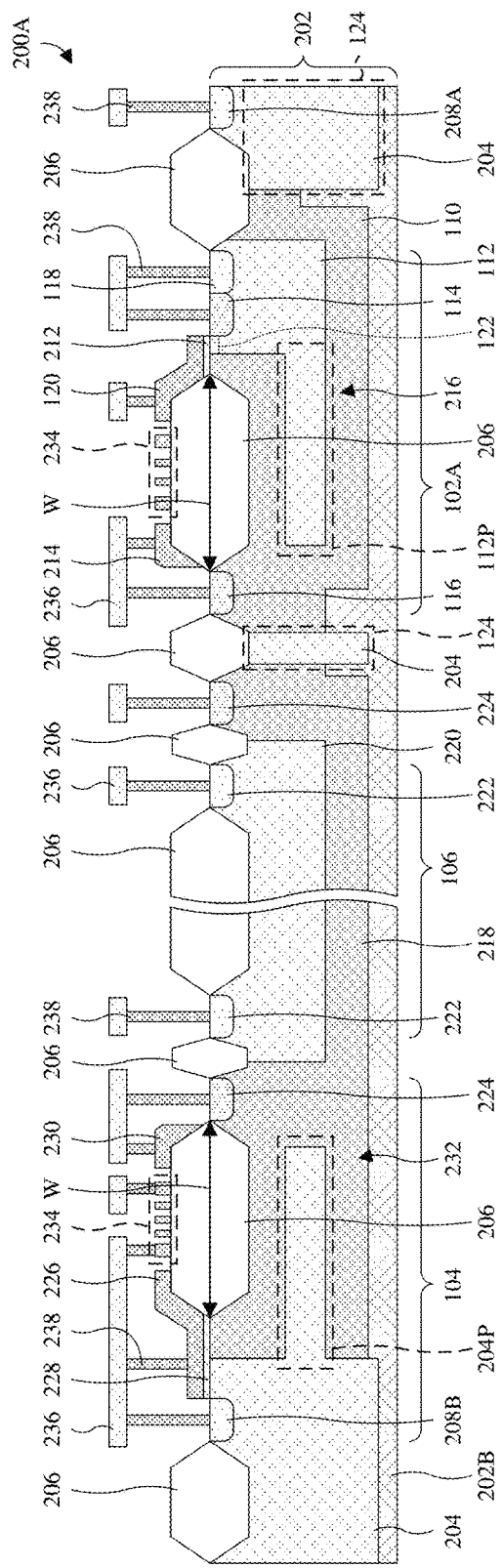
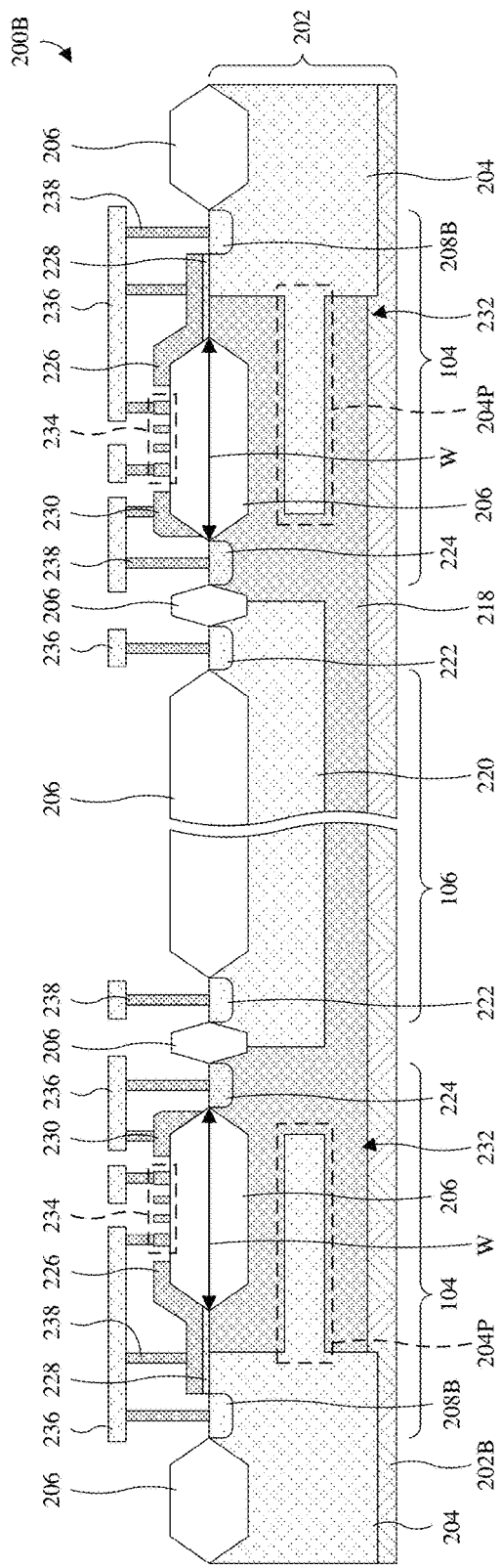
Fig. 2A
Fig. 2B

HIGH VOLTAGE METAL-OXIDE-SEMICONDUCTOR (HVMOS) DEVICE INTEGRATED WITH A HIGH VOLTAGE JUNCTION TERMINATION (HVJT) DEVICE

REFERENCE TO RELATED APPLICATIONS

This Application is a Continuation of U.S. application Ser. No. 16/601,998, filed on Oct. 15, 2019, which is a Continuation of U.S. application Ser. No. 15/964,636, filed on Apr. 27, 2018 (now U.S. Pat. No. 10,535,730, issued on Jan. 14, 2020), which claims the benefit of U.S. Provisional Application No. 62/564,695, filed on Sep. 28, 2017. The contents of the above-referenced Patent Applications are hereby incorporated by reference in their entirety.

BACKGROUND

Ultrahigh voltage metal-oxide-semiconductor (MOS) devices are semiconductor devices that can sustain operation at voltages of several hundred volts, such as, for example, voltages around 600 volts. Among other things, ultrahigh voltage MOS devices are used for level shifters in high-side gate driver circuits. Such a level shifter translates an input signal at a first voltage level to an output signal at a second voltage level to resolve incompatibility between devices that respectively operate at the first and second voltage levels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B illustrate various cross-sectional views of some more detailed embodiments of the IC of FIG. 1.

DETAILED DESCRIPTION

Figure 1:
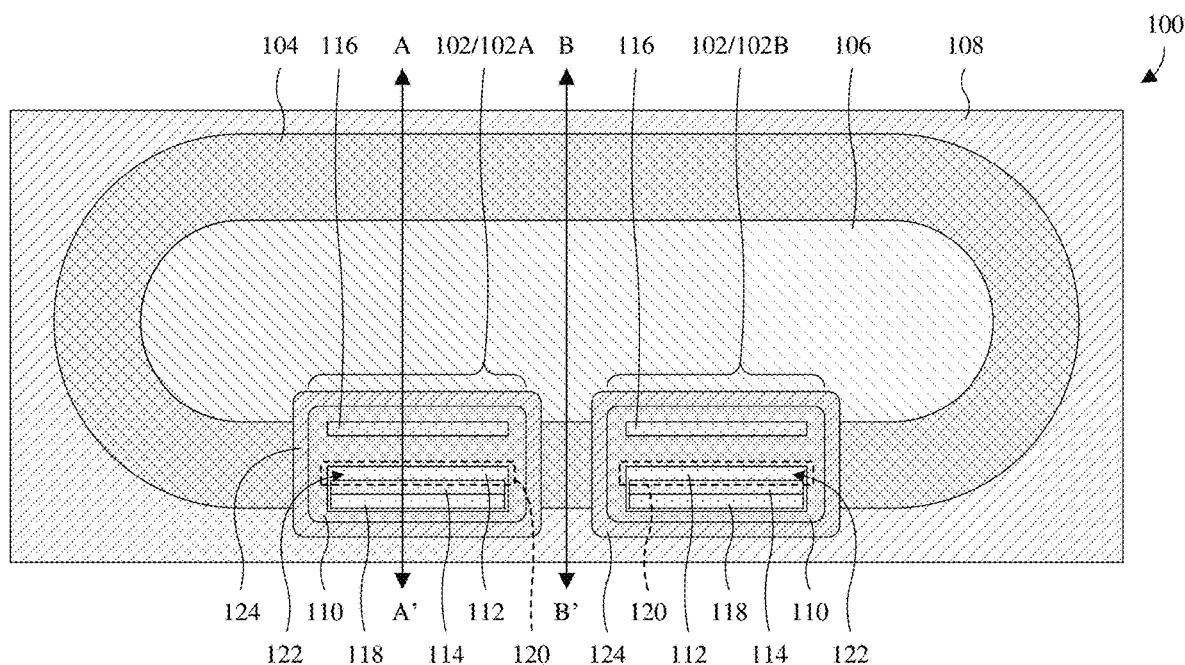
FIG. 1 illustrates a top layout of some embodiments of an integrated circuit (IC) in which a high voltage metal-oxide-semiconductor (HVMOS) device is integrated with a high voltage junction termination (HVJT) device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) may, for example, comprise a high side area and a low voltage area. The high side area includes devices that operate at a high voltage level, and the low voltage area includes devices that operate at a comparatively low voltage level. A high voltage junction termination (HVJT) device has a ring-shaped top layout that surrounds and demarcates the high side area. Further, the HVJT device separates the high side area from the low voltage area and a high voltage metal-oxide-semiconductor (HVMOS) device. The HVMOS device partially or wholly defines a level shifter translating an input signal at the low voltage level to an output signal at the high voltage level. Further, the HVMOS device is electrically coupled to a device in the high side area to provide the output signal to the device. Such electrical coupling may, for example, be performed externally by wire bonding, or internally by metal wires of a back-end-of-line (BEOL) interconnect structure.

A challenge with using wire bonding to externally electrically couple the HVMOS device to the device in the high side area is that wire bonding has high process costs and low reliability in extreme environments (e.g., environments with high pressure and/or high temperature). A challenge with using metal wires of a BEOL interconnect structure to internally electrically couple the HVMOS device to the device in the high side area is that the metal wires depend upon an opening in the HVJT device. This leads to reliability issues (e.g., a low breakdown voltage), limits the number of HVMOS devices, and increases complexity.

In view of the foregoing, various embodiments of the present application are directed towards an IC in which an HVMOS device is integrated with a HVJT device. In some embodiments, a first drift well and a second drift well are in a substrate. The first and second drift wells border in a ring-shaped pattern and have a first doping type. The ring-shaped pattern may be circular ring shaped, square ring shaped, rectangular ring shaped, triangular ring shaped, or some other closed path shape. A peripheral well is in the substrate and has a second doping type opposite the first doping type. The peripheral well surrounds and separates the first and second drift wells. A body well is in the substrate and has the second doping type. Further, the body well overlies the first drift well and is spaced from the peripheral well by the first drift well. A gate electrode overlies a junction between the first drift well and the body well. The first drift well, the body well, and the gate electrode partially define the HVMOS device, and the second drift well and the peripheral well partially defined the HVJT device. A high side well is in the substrate and has the second doping type. Further, the high side well overlies the second drift well and is spaced from the peripheral well by the second drift well.

Integrating the HVMOS device and the HVJT device results in smaller IC chip area and higher reliability. For example, because the HVMOS device and the HVJT device are integrated, the two devices share a common IC chip area instead of separate IC chip areas. This leads to a reduction in overall IC chip area (e.g., about a 25-60% reduction). As another example, because the HVMOS device and the HVJT device are integrated, the HVMOS device and the HVJT device may be electrically coupled without wire bonding and without an opening in the HVJT device. This leads to enhanced reliability.

By surrounding and separating the first and second drift wells, the peripheral well may define an isolation ring separating the HVMOS device from the HVJT device. The isolation ring may be circular ring shaped, square ring shaped, rectangular ring shaped, triangular ring shaped, or some other closed path shape. The isolation ring facilitates efficient integration of the HVMOS device with the HVJT device without increased IC chip area. The efficient integration allows the number of HVMOS device to be increased and/or the size of the high side well to be increased without complex redesigns and increased IC chip area by the HVJT and HVMOS devices. Further, the efficient integration allows a voltage handling capability and/or a current handling capability of the HVMOS device to be varied without complex redesigns.

With reference to FIG. 1, a top layout 100 of some embodiments of an IC in which HVMOS devices 102 are integrated with a HVJT device 104 is provided. The HVMOS devices 102 and the HVJT device 104 border and collectively define a composite structure. The composite structure extends laterally in a closed path along a boundary of a high side area 106 of the IC to completely surround the high side area 106. In some embodiments, the composite structure is square ring shaped, rectangular ring shaped, triangular ring shaped, circular ring shaped, or some other closed path shape. Further, the composite structure is surrounded by a low voltage area 108 of the IC.

The high side area 106 accommodates semiconductor devices (not shown) operating at a high voltage level, whereas the low voltage area 108 accommodates semiconductor devices (not shown) operating at a low voltage level. The high voltage level is high relative to the low voltage level and may be or comprise, for example, voltages between about 300-1200 volts, voltages between about 300-750 volts, voltages between about 750-1200 volts, or voltages in excess of about 300 volts. The low voltage level may be or comprise, for example, voltages between about 1-20 volts, voltages between about 1-10 volts, voltages between about 10-20 volts, or voltages less than about 20 volts.

The HVJT device 104 physically and electrically separates the high side area 106 from the low voltage area 108. Further, the HVJT device 104 is or comprises a diode. The diode is capable of sustained operation at the high voltage level and is configured to operate in a reverse biased state. The HVMOS devices 102 are transistors or some other switching devices capable of sustained operation at the high voltage level. For example, the HVMOS devices 102 may be laterally diffused metal-oxide-semiconductor (LDMOS) devices or some other suitable metal-oxide-semiconductor (MOS) devices, and/or may sustain operation while source-drain voltages are at the high voltage level (e.g., about 600 volts). In some embodiments, the HVMOS devices 102 partially or wholly define a level shifter translating an input signal at the low voltage level to an output signal at the high voltage level. The HVMOS devices 102 comprise a first HVMOS device 102A and a second HVMOS device 102B.

Each of the HVMOS devices 102 is on an HVMOS drift well 110 and an HVMOS body well 112, and comprises a first source/drain region 114, a second source/drain region 116, a body contact region 118, and a gate electrode 120. The HVMOS drift well 110 is a semiconductor region with a first doping type and surrounds the HVMOS body well 112. The HVMOS body well 112 is a semiconductor region with a second doping type, opposite the first doping type, and defines a selectively-conductive channel 122 of the HVMOS device. The first doping type may, for example, be n-type, and the second doping type may, for example, be p-type, or vice versa. Further, the HVMOS body well 112 underlies the first source/drain region 114 and the body contact region 118 when viewed in cross-section (not visible within the top layout 100 of FIG. 1).

The first and second source/drain regions 114, 116 are spaced by the HVMOS drift and body wells 110, 112, such that the first source/drain region 114 borders the low voltage area 108 and the second source/drain region 116 borders the high side area 106. The first and second source/drain regions 114, 116 are semiconductor regions with the first doping type and higher doping concentrations than the HVMOS drift well 110. The body contact region 118 is a semiconductor region with the second doping type and a higher doping concentration than the HVMOS body well 112. The gate electrode 120 (shown in phantom) overlies the HVMOS body well 112, such that the gate electrode 120 borders the first source/drain region 114 and is mostly between the first and second source/drain regions 114, 116. The gate electrode 120 may be or comprise, for example, doped polysilicon, metal, or some other conductive material.

The HVMOS devices 102 are individually surrounded by isolation rings 124 physically and electrically separating the HVMOS devices 102 from the high side area 106 and the HVJT device 104. For example, the isolation rings 124 may define diodes with a drift region of the HVJT device 104 (discussed hereafter) and/or the HVMOS drift wells 110, and the diodes may operate in the blocking or reversed biased state to provide electrical separation. While the isolation rings 124 may be circular ring shaped, the isolation rings 124 are not limited to being circular ring shaped. The isolation rings 124 may, for example, be square ring shaped, rectangular ring shaped, triangular ring shaped, or some other closed path shape. In some embodiments, the isolation rings 124 are semiconductor regions with an opposite doping type as the HVMOS drift wells 110, and/or the same doping type as the HVMOS body well 112. The isolation rings 124 facilitate efficient integration of the HVMOS devices 102 with the HVJT device 104 without increased IC chip area.

As seen hereafter, the integration allows the number of HVMOS devices to be increased and/or the size of the high side area 106 to be increased without complex redesigns and without the HVMOS and HVJT devices 102, 104 using more IC chip area. Further, the integration allows voltage handling capabilities and/or current handling capabilities of the HVMOS devices 102 to be varied without complex redesigns. Further yet, the integration leads to low IC chip area and high reliability. For example, because the HVMOS devices 102 and the HVJT device 104 are integrated, the HVMOS and HVJT devices 102, 104 share a common IC chip area instead of separate IC chip areas. This leads to a reduction in overall IC chip area. As another example, because the HVMOS devices 102 and the HVJT device 104 are integrated, the HVMOS and HVJT devices 102, 104 may be electrically coupled without wire bonding and without an opening in the HVJT device 104. This leads to enhanced reliability.

While the IC is illustrated as having two HVMOS devices (i.e., the first HVMOS device 102A and the second HVMOS device 102B) in FIG. 1, the first or the second HVMOS device 102A, 102B may be omitted in other embodiments. Further, as seen hereafter, the IC may have one or more additional HVMOS devices in other embodiments. In such embodiments, the one or more additional HVMOS devices are each as described above and are each positioned along the boundary of the high side area 106.

With reference to FIG. 2A, a cross-sectional view 200A of some more detailed embodiments of the IC of FIG. 1 is provided. The cross-sectional view 200A may, for example, be taken along line A-A' in FIG. 1. As illustrated, the first HVMOS device 102A and the HVJT device 104 are on a semiconductor substrate 202. The semiconductor substrate 202 may be, for example, a bulk silicon substrate, a group III-V substrate, a silicon-on-insulator (SOI) substrate, or some other semiconductor substrate.

A peripheral well 204 is in the semiconductor substrate 202 and overlies a bulk semiconductor region 202B of the semiconductor substrate 202. The peripheral well 204 comprises a pair of segments between which the first HVMOS device 102A and the HVJT device 104 are sandwiched, and further comprises the isolation ring 124. When viewed top down, the isolation ring 124 extends laterally along a boundary of the first HVMOS device 102A to completely enclose the first HVMOS device 102A. Note this is not visible within the cross-sectional-sectional view 200A of FIG. 2A. In some embodiments, the peripheral well 204 has an elevated doping concentration at the isolation ring 124 relative to remainder of the peripheral well 204. Further, in some embodiments, the peripheral well 204 has the same doping type as the bulk semiconductor region 202B.

An isolation structure 206 overlies the peripheral well 204. The isolation structure 206 comprises a dielectric material (e.g., silicon oxide), and may be or comprise, for example, a shallow trench isolation (STI) structure, a field oxide (FOX) structure, a local oxidation of silicon (LOCOS) structure, or some other isolation structure. Further, a first peripheral contact region 208A and a second peripheral contact region 208B overlie the peripheral well 204. The first peripheral contact region 208A is adjacent to the first HVMOS device 102A, and the second peripheral contact region 208B is adjacent to the HVJT device 104. The first and second peripheral contact regions 208A, 208B are in the semiconductor substrate 202 and have the same doping type as, but a higher doping concentration than, the peripheral well 204. In some embodiments, the first and second peripheral contact regions 208A, 208B are electrically coupled to ground and/or or a cathode of a low voltage power supply.

The HVMOS drift well 110 and the HVMOS body well 112 are in the semiconductor substrate 202 and overlie the bulk semiconductor region 202B. Further, the first HVMOS device 102A is on the HVMOS drift well 110 and the HVMOS body well 112. The first HVMOS device 102A may be, for example, an LDMOS transistor or some other switching device. The HVMOS drift well 110 underlies and laterally surrounds the HVMOS body well 112, such that the HVMOS drift well 110 spaces (e.g., completely spaces) the HVMOS body well 112 from the bulk semiconductor region 202B and the peripheral well 204. Further, the HVMOS drift well 110 has an opposite doping type as the peripheral well 204 and the HVMOS body well 112. The HVMOS body well 112 has the same doping type as the peripheral well 204. In some embodiments, the isolation structure 206 covers a boundary along which the HVMOS drift well 110 contacts the peripheral well 204.

The second source/drain region 116 overlies the HVMOS drift well 110, closer to the high side area 106 than the first source/drain region 114. The first source/drain region 114 and the body contact region 118 overlie the HVMOS body well 112, such that the first source/drain region 114 is between the body contact region 118 and the second source/drain region 116. The first and second source/drain regions 114, 116 are laterally separated by the HVMOS drift well 110, the HVMOS body well 112, and the isolation structure 206. The first source/drain region 114, the second source/drain region 116, and the body contact region 118 are in the semiconductor substrate 202. The first and second source/drain regions 114, 116 have the same doping type as, but a higher doping concentration than, the HVMOS drift well 110. The body contact region 118 has the same doping type as, but a higher doping concentration than, the HVMOS body well 112. In some embodiments, the first source/drain region 114 and the body contact region 118 are electrically shorted together.

The selectively-conductive channel 122 is in the HVMOS body well 112. The selectively-conductive channel 122 extends along a top surface of the semiconductor substrate 202, from the first source/drain region 114 to the HVMOS drift well 110. The HVMOS drift well 110 extends from the selectively-conductive channel 122 to the second source/drain region 116. Further, the isolation structure 206 overlies the HVMOS drift well 110, between the selectively-conductive channel 122 and the second source/drain region 116. In some embodiments, a width W of the isolation structure 206 on the HVMOS drift well 110 is about 50-200 micrometers, about 75-125 micrometers, or about 100 micrometers.

The gate electrode 120 overlies the selectively-conductive channel 122 and the isolation structure 206, and further extends along a sidewall of the isolation structure 206 from overlying the selectively-conductive channel 122 to overlying the isolation structure 206. Further, the gate electrode 120 is electrically insulated from the selectively-conductive channel 122 by a gate dielectric layer 212. The gate dielectric layer 212 may be or comprise, for example, silicon oxide, hafnium oxide, or some other dielectric material. In some embodiments, an HVMOS field plate 214 borders the second source/drain region 116. The HVMOS field plate 214 extends along a sidewall of the isolation structure 206 and overlies the isolation structure 206. In some embodiments, the HVMOS field plate 214 is electrically shorted to the second source/drain region 116. The HVMOS field plate 214 may be or comprise, for example, doped polysilicon, metal, or some other conductive material.

During operation of the first HVMOS device 102A, the selectively-conductive channel 122 selectively conducts depending upon whether a voltage from the gate electrode 120 to the first source/drain region 114 exceeds a threshold voltage. Further, while the first HVMOS device 102A is in the non-conducting or blocking state, the HVMOS drift well 110 acts as resistor to absorb high electric fields associated with high source-drain voltages (e.g., voltages in excess of 300 volts). This, in turn, allows the first HVMOS device 102A to sustain operation at the high source-drain voltages. In some embodiments, the HVMOS drift well 110 is widened to increase the separation between the HVMOS body well 112 and the second source/drain region 116, thereby increasing resistance and voltages at which the first HVMOS device 102A can sustain operation. In such embodiments, the width W of the isolation structure 206 on the HVMOS drift well 110 is increased with the HVMOS drift well 110. In some embodiments, the doping concentration of the HVMOS drift well 110 is reduced, thereby increasing resistance and voltages at which the first HVMOS device 102A can sustain operation. A challenge with widening the HVMOS drift well 110 and/or decreasing the doping concentration of the HVMOS drift well 110 is that the resistance of the first HVMOS device 102A in the conducting or non-blocking state may become high and power efficiency may become low. Further, a challenge with widening the HVMOS drift well 110 is that IC chip area consumed by the first HVMOS device 102A may become high.

In some embodiments, the HVMOS body well 112 comprises a protrusion 112P protruding laterally towards the high side area 106. The protrusion 112P results in an alternating stack of n-type and p-type semiconductor regions that define an HVMOS reduced surface field (RESURF) structure 216 with multiple PN junctions. The multiple PN junctions comprise: 1) a first PN junction at a boundary between a bottom surface of the protrusion 112P and the HVMOS drift well 110; and 2) a second PN junction at a boundary between a top surface of the protrusion 112P and the HVMOS drift well 110. In some embodiments, the multiple PN junctions further comprise a third PN junction at a boundary between the bulk semiconductor region 202B and the HVMOS drift well 110. The multiple PN junctions may, for example, also be known as a Super Junction. The HVMOS RESURF structure 216 laterally and vertically distributes the high electric field associated with high source-drain voltages, such that the maximum electric field is low in the blocking or OFF state. For example, the high electric field may be vertically distributed across the multiple PN junctions, and/or may be laterally distributed from the second source/drain region 116 to the HVMOS body well 112. This, in turn, allows the first HVMOS device 102A to sustain operation at high voltages. Further, the HVMOS RESURF structure 216 does not depend upon a high resistance from the second source/drain region 116 to the HVMOS body well 112, such that IC chip area may be low and the resistance of the first HVMOS device 102A n the non-blocking state may be low.

A HVJT drift well 218 overlies the bulk semiconductor region 202B and is sandwiched between opposing segments of the peripheral well 204. Further, the HVJT drift well 218 underlies and laterally surrounds a high side well 220 at the high side area 106, such that the HVJT drift well 218 spaces (e.g., completely spaces) the high side well 220 from the bulk semiconductor region 202B and the peripheral well 204. The HVJT drift well 218 and the high side well 220 are in the semiconductor substrate 202 and respectively have opposite doping types. In some embodiments, the HVJT drift well 218 has the same doping type as the HVMOS drift well 110, and/or the high side well 220 has the same doping type as the HVMOS body well 112 and the peripheral well 204. In some embodiments, the peripheral well 204, the HVMOS body well 112, the high side well 220, and the bulk semiconductor region 202B are p-type, whereas the HVMOS drift well 110 and the HVJT drift well 218 are n-type, or vice versa. In some embodiments, the isolation structure 206 partially covers the high side well 220 and/or covers a boundary along which the high side well 220 contacts the HVJT drift well 218.

A high side contact region 222 overlies the high side well 220 and comprises a pair of segments on opposite sides of the high side well 220. In some embodiments, when viewed top down, the high side contact region 222 extends laterally along a boundary of the high side well 220 in a closed path and/or has a ring-shape. Note this is not visible within the cross-sectional-sectional view 200A of FIG. 2A. The high side contact region 222 is in the semiconductor substrate 202 and has the same doping type as, but a higher doping concentration than, the high side well 220.

A HVJT drift contact region 224 overlies the HVJT drift well 218, adjacent to the high side well 220, and comprises a pair of segments between which the high side well 220 and the high side contact region 222 are sandwiched. In some embodiments, when viewed top down, the HVJT drift contact region 224 extends laterally along a boundary of the high side well 220 in a closed path and/or has a ring-shape. Note this is not visible within the cross-sectional-sectional view 200A of FIG. 2A. The HVJT drift contact region 224 is in the semiconductor substrate 202 and has the same doping type as, but a higher doping concentration than, the HVJT drift well 218.

The HVJT device 104 is or comprises a diode, and is defined in part by the HVJT drift well 218, the peripheral well 204, the second peripheral contact region 208B, and the HVJT drift contact region 224. An anode of the diode is defined by the second peripheral contact region 208B, and a cathode of the diode is defined by the HVJT drift contact region 224, or vice versa. Further, the HVJT drift well 218 and the peripheral well 204 define a PN junction of the diode.

The isolation structure 206 overlies the HVJT drift well 218, between the second peripheral contact region 208B and the HVJT drift contact region 224. Further, in some embodiments, the isolation structure 206 has the same width W between the second peripheral contact region 208B and the HVJT drift contact region 224 as between the first and second source/drain regions 114, 116. A first HVJT field plate 226 overlies a PN junction at which the HVJT drift well 218 contacts the peripheral well 204, between the second peripheral contact region 208B and the isolation structure 206. Further, the first HVJT field plate 226 extends along a sidewall of the isolation structure 206 from overlying the PN junction to overlying the isolation structure 206. The first HVJT field plate 226 is electrically insulated from the HVJT drift well 218 and the peripheral well 204 by a field plate dielectric layer 228. The field plate dielectric layer 228 may be or comprise, for example, silicon oxide, hafnium oxide, or some other dielectric material. In some embodiments, the first HVJT field plate 226 is electrically shorted to the second peripheral contact region 208B. The first HVJT field plate 226 may be or comprise, for example, doped polysilicon, metal, or some other conductive material.

In some embodiments, a second HVJT field plate 230 borders the HVJT drift contact region 224, between the first HVJT field plate 226 and the HVJT drift contact region 224. The second HVJT field plate 230 extends along a sidewall of the isolation structure 206 and overlies the isolation structure 206. In some embodiments, the second HVJT field plate 230 is electrically shorted to the HVJT drift contact region 224. The second HVJT field plate 230 may be or comprise, for example, doped polysilicon, metal, or some other conductive material.

During operation of the HVJT device 104, the HVJT device 104 provides electrical separation between the peripheral well 204 and the high side well 220 while the high side well 220 is at a higher voltage than the peripheral well 204. Further, while the HVJT device 104 is in the non-conducting or blocking state, the HVJT drift well 218 and the peripheral well 204 act as resistors between the second peripheral contact region 208B and the HVJT drift contact region 224 to absorb high electric fields associated with high voltages (e.g., voltages in excess of 300 volts). This, in turn, allows the HVJT device 104 to sustain operation at the high voltages. In some embodiments, the HVJT drift well 218 is widened to increase the separation between the second peripheral contact region 208B and the HVJT drift contact region 224, thereby increasing resistance and voltages at which the HVJT device 104 can sustain operation. In such embodiments, the width W of the isolation structure 206 on the HVJT drift well 218 is also increased with the HVJT drift well 218. In some embodiments, the doping concentration of the HVJT drift well 218 is reduced, thereby increasing resistance and voltages at which the HVJT device 104 can sustain operation. A challenge with widening the HVJT drift well 218 and/or decreasing the doping concentration of the HVJT drift well 218 is that the resistance of the HVJT device 104 in the conducting or non-blocking state may become high, and power efficiency may become low. Further, a challenge with widening the HVJT drift well 218 is that IC chip area consumed by the HVJT device 104 may become high.

In some embodiments, the peripheral well 204 comprises a protrusion 204P protruding towards the high side area 106. The protrusion 204P results in an alternating stack of n-type and p-type semiconductor regions that define an HVJT RESURF structure 232 with multiple PN junctions. The multiple PN junctions comprise: 1) a first PN junction at a boundary between a bottom surface of the protrusion 204P and the HVJT drift well 218; and 2) a second PN junction at a boundary between a top surface of the protrusion 204P and the HVJT drift well 218. In some embodiments, the multiple PN junctions further comprise a third PN junction at a boundary between the bulk semiconductor region 202B and the HVJT drift well 218. The HVJT RESURF structure 232 laterally and vertically distributes the high electric field associated with high voltages, such that the maximum electric field is low in the blocking state. For example, the high electric field may be vertically distributed across the multiple PN junctions, and/or may be laterally distributed from the second peripheral contact region 208B and the HVJT drift contact region 224. This allows the HVJT device 104 to sustain operation at high voltages. Further, the HVJT RESURF structure 232 does not depend upon a high resistance from the second peripheral contact region 208B and the HVJT drift contact region 224, such that IC chip area may be low and the resistance of the HVJT device 104 in the non-blocking state may be low.

The HVJT RESURF structure 232 laterally distributes (e.g., from the second peripheral contact region 208B and the HVJT drift contact region 224) and vertically distributes (e.g., across the multiple PN junctions) the high electric field associated with high voltages, such that the maximum electric field from the second peripheral contact region 208B and the HVJT drift contact region 224 is low in the blocking state. This, in turn, allows the HVJT device 104 to sustain operation at high voltages while having a low ON resistance and a low IC chip area.

In some embodiments, a spiral structure 234 overlies the isolation structure 206 on the HVJT drift well 218 and the HVMOS drift well 110. When viewed top down, the spiral structure 234 extends laterally and continuously in a spiral over the isolation structure 206. Note this is not visible within the cross-sectional-sectional view 200A of FIG. 2A. The spiral structure 234 serves as a field plate to manipulate (e.g., increase or decrease) carrier mobility thereunder. In some embodiments, a first end of the spiral structure 234 is electrically coupled to the first and second peripheral contact regions 208A, 208B and/or ground. In some embodiments, a second end of the spiral structure, opposite the first end, is electrically coupled to the high side contact region 222 and/or the HVJT drift contact region 224. The spiral structure 234 may be or comprise, for example, doped polysilicon, metal, or some other conductive material.

Conductive wires 236 and conductive vias 238 are stacked over the semiconductor substrate 202 and define conductive paths. For ease of illustration, only some of the conductive wires 236 are labeled 236, and only some of the conductive vias 238 are labeled 238. The conductive paths provide electrically coupling between the various contact regions (e.g., the HVJT drift contact region 224), the various fields plates (e.g., the first HVJT field plate 226), the gate electrode 120, the first and second source/drain regions 114, 116, and the spiral structure 234. For example, one of the conductive paths may electrically couple the first source/drain region 114 to the body contact region 118. The conductive wires 236 and the conductive vias 238 may be or comprise, for example, copper, aluminum copper, aluminum, tungsten, some other conductive material, or any combination of the foregoing.

While FIG. 2A illustrates and describes the first HVMOS device 102A, it is to be understand that the second HVMOS device 102B of FIG. 1 may, for example, be as the first HVMOS device 102A is illustrated and described in FIG. 2A. More generally, each HVMOS device described herein may, for example, be as the first HVMOS device 102A is illustrated and described in FIG. 2A.

Figure 15:
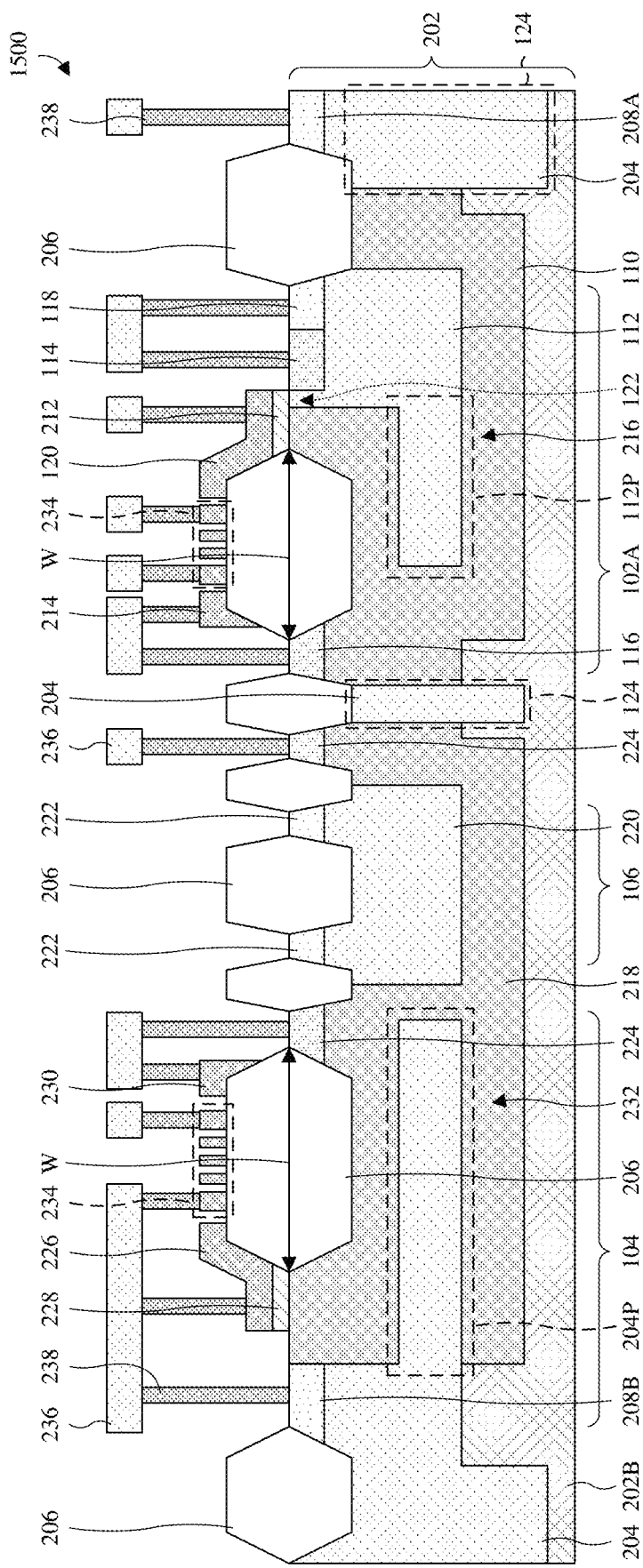
FIG. 15 illustrates a cross-sectional view of some alternative embodiments of the IC of FIG. 2A.

With reference to FIG. 15, a cross-sectional view 1500 of some alternative embodiments of the IC of FIG. 2A is provided in which constituents of the IC are varied. For example, the protrusion 204P of the peripheral well 204 protrudes to a sidewall directly under the HVJT drift contact region 224.

With reference to FIG. 2B, a cross-sectional view 200B of some more detailed embodiments of the IC of FIG. 1 is provided. The cross-sectional view 200B may, for example, be taken along line B-B' in FIG. 1. As illustrated, the HVJT device 104 is on opposite sides of the high side area 106. Further, the first HVMOS device 102A of FIG. 2A and the isolation ring 124 of FIG. 2A are not visible (i.e., are outside the cross-sectional view 200B).

Figure 3A:
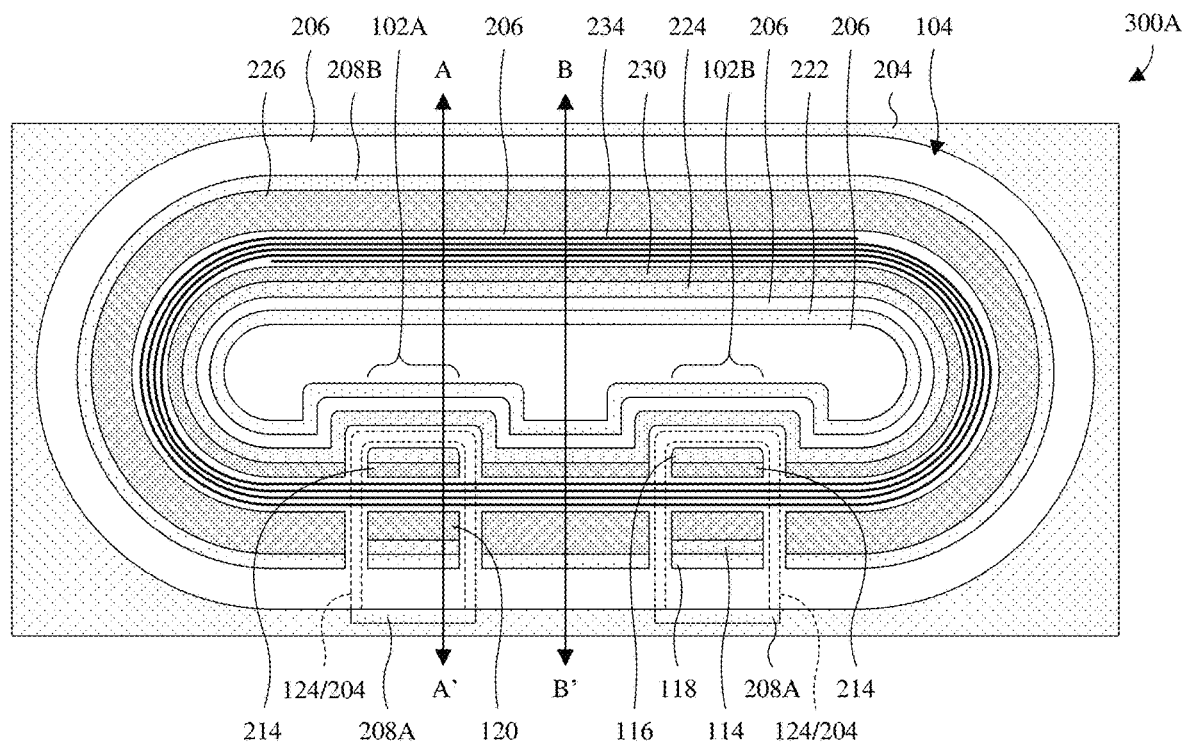
FIGS. 3A and 3B illustrate various top layouts of some more detailed embodiments of the IC of FIG. 1.

With reference to FIG. 3A, a top layout 300A of some more detailed embodiments of the IC of FIG. 1 is provided. The cross-sectional view 200A of FIG. 2A may, for example, be taken along line A-A' in FIG. 3A, and the cross-sectional view 200B of FIG. 2B may, for example, be taken along line B-B' in FIG. 3A. In some embodiments, HVMOS drift wells 110 of the first and second HVMOS devices 102A, 102B and/or HVMOS body wells 112 of the first and second HVMOS devices 102A, 102B may also be known as switching device wells. In some embodiments, the HVJT drift well 218 of the HVJT device 104 may also be known as a termination device well.

As illustrated by FIG. 3A, the high side contact region 222 and the HVJT drift contact region 224 are ring shaped, and conform to the isolation rings 124 of the first and second HVMOS devices 102A, 102B. In some embodiments, the high side contact region 222 and the HVJT drift contact region 224 serve as guard rings or pickup rings. In some embodiments, the high side contact region 222 is connected to the lowest voltage level in a circuit within which the IC is applied, and the HVJT drift contact region 224 is connected to highest voltage level in the circuit, to safeguard devices on the high side well 220 (see FIGS. 2A and 2B) against parasitic latching up and turning on. As should be appreciated, while the high side contact region 222 and the HVJT drift contact region 224 may be circular ring shaped, the high side contact region 222 and the HVJT drift contact region 224 are not limited to circular ring shaped and may be square ring shaped, rectangular ring shaped, triangular ring shaped, or some other closed path shape.

Also illustrated by FIG. 3A, the spiral structure 234 extends continuously over the isolation structure 206. In some embodiments, a first end of the spiral structure 234 is electrically coupled to the first and second peripheral contact regions 208A, 208B and/or ground. In some embodiments, a second end of the spiral structure, opposite the first end, is electrically coupled to the high side contact region 222 and/or the HVJT drift contact region 224.

Figure 3B:
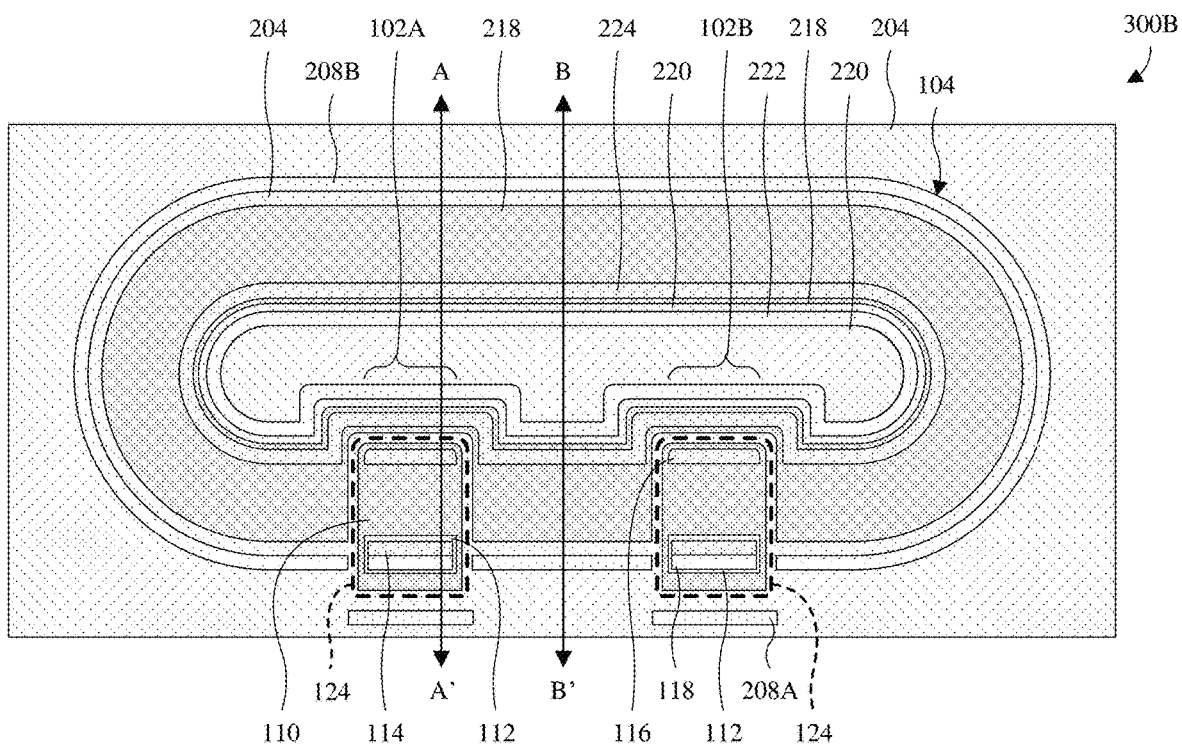

With reference to FIG. 3B, a top layout 300B of some more detailed embodiments of the IC of FIG. 1 is provided. FIG. 3B is a variant of FIG. 3A in which the isolation structure 206, the gate electrode 120, the various field plates (e.g., the first HVJT field plate 226), and the spiral structure 234 have been removed to show underlying structure.

As illustrated by FIG. 3B, the peripheral well 204 completely surrounds the HVJT drift well 218, and is completely spaced from the HVMOS body wells 112 by the HVMOS drift wells 110. Absent such spacing, the HVMOS body wells 112 would be at the same voltage as the peripheral well 204, which may be undesirable for certain applications of the first and second HVMOS devices 102A, 102B. Also illustrated by FIG. 3B, the HVJT drift well 218 is ring shaped, and conforms to the isolation rings 124 of the first and second HVMOS devices 102A, 102B. As should be appreciated, while the HVJT drift well 218 may be circular ring shaped, the HVJT drift well 218 is not limited to circular ring shaped and may be square ring shaped, rectangular ring shaped, triangular ring shaped, or some other closed path shape.

The isolation ring 124 facilitates the integration of the first and second HVMOS devices 102A, 102B with the HVJT device 104 by allowing the first and second HVMOS devices 102A, 102B to be sandwiched between the HVJT drift well 218 and the peripheral well 204 without breaking a continuity of the HVJT drift well 218 and the peripheral well 204. As described above, the HVJT device 104 is or comprises a diode, and the HVJT drift well 218 and the peripheral well 204 define a PN junction of the diode. Such integration leads to low IC chip area (e.g., a 25-60% reduction in IC chip area), high reliability, and simplified design iterations. For example, because of the integration, the first HVMOS device 102A is not remote from the HVJT device 104 and IC chip area is low. As another example, because of the integration, the first HVMOS device 102A may be electrically coupled to the HVJT device 104 locally and without the use of remote wire bonding or complex interconnect structures. This, in turn, increases the reliability of the IC and reduces manufacturing costs.

As noted above, the isolation rings 124 may define diodes that operate in the blocking or reversed biased state to provide electrical separation between the HVJT device 104 and the first and second HVMOS devices 102A, 102B. The isolation rings 124 define ring-shaped PN junctions with the HVMOS drift wells 110. These ring-shaped PN junctions respectively surround the first and second HVMOS devices 102A, 102B and, where the HVMOS drift wells 110 are n-type, may prevent current from flowing from the first and second HVMOS devices 102A, 102B to the HVJT device 104. The isolation rings 124 (and a remainder of the peripheral well 204) define a ring-shaped PN junction with the HVJT drift well 218. This ring-shaped PN junction defines the HVJT device 104 and, where the HVMOS drift well 110 is n-type, may prevent current from flowing from the HVJT device 104 to the first and second HVMOS devices 102A, 102B. In some embodiments, the isolation rings 124 define NPN junctions with the HVJT drift well 218 the HVMOS drift wells 110.

Figure 4A:
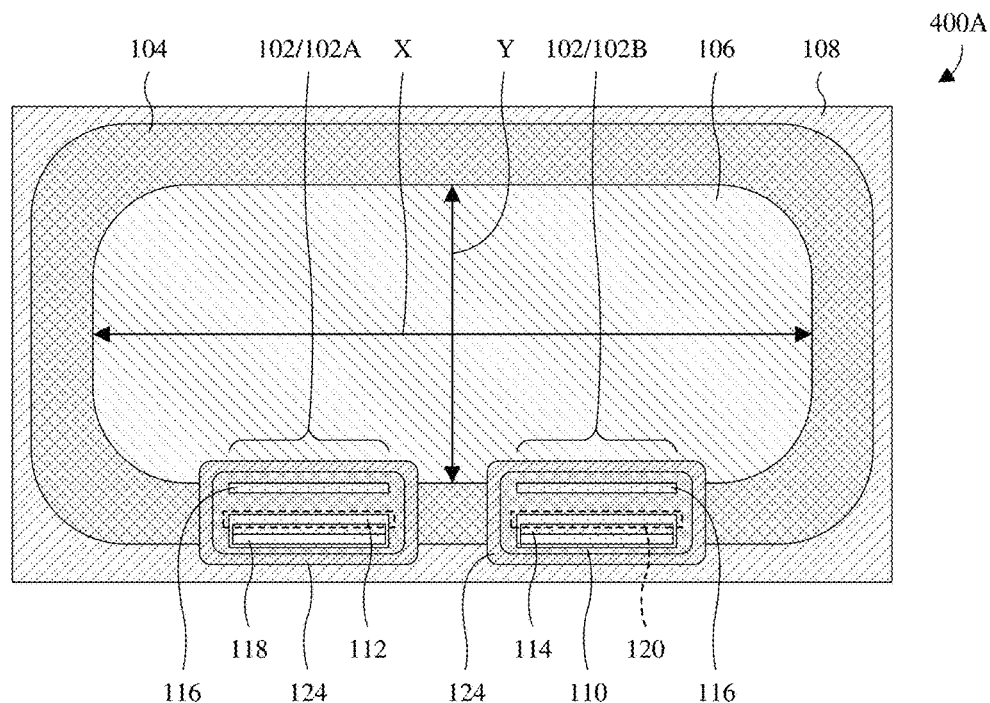
FIGS. 4A and 4B illustrate various top layouts of various other embodiments of the IC of FIG. 1 in which a geometry of a high side area is varied.
Figure 4B:
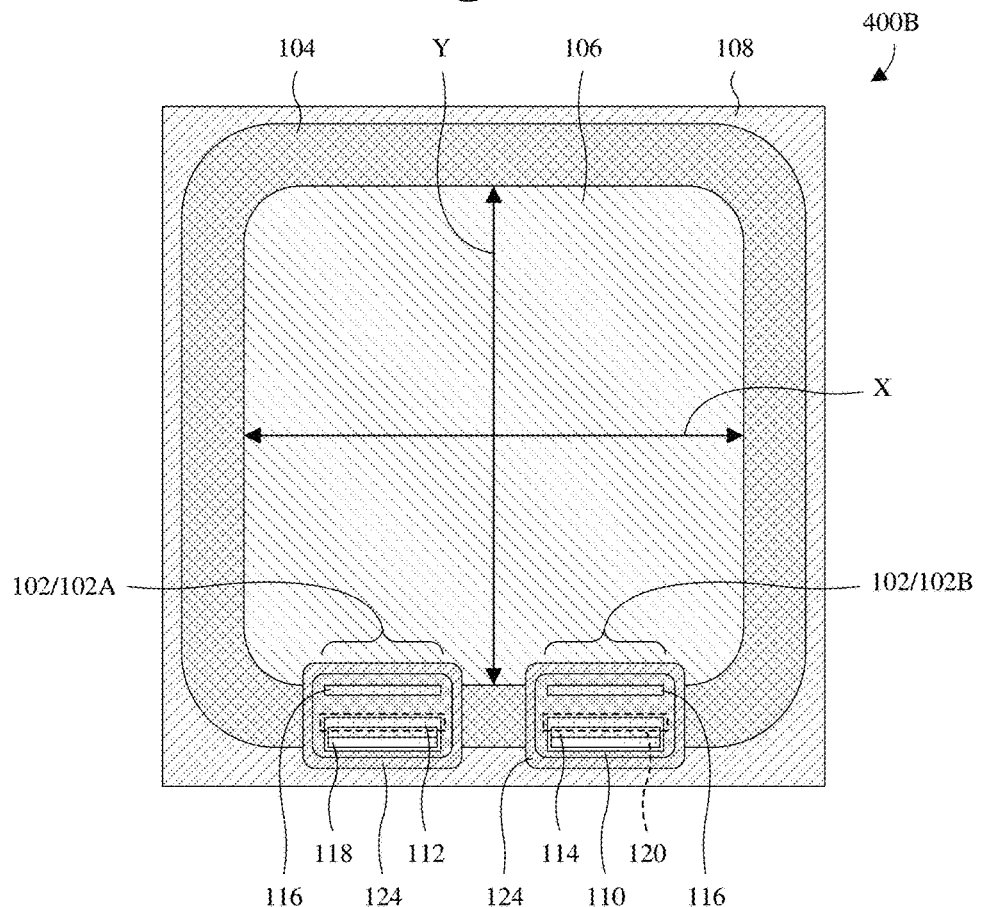

With reference to FIGS. 4A and 4B, top layouts 400A, 400B of various other embodiments of the IC of FIG. 1 are provided in which a geometry of a high side area 106 is scaled in the X dimension and/or the Y dimension to vary the size of the high side area 106. For example, the geometry of the high side area 106 may be scaled to accommodate more or less devices. Because the isolation rings 124 facilitate efficient integration between the HVJT device 104 and the HVMOS devices 102, the geometry of the high side area 106 may be readily scaled without complex redesigns.

With reference to FIGS. 5A-5D, top layouts 500A-500D of various other embodiments of the IC of FIG. 1 are provided in which geometries of the HVMOS devices 102 are varied according to current handling requirements and voltage handling requirements.

Figure 5A:
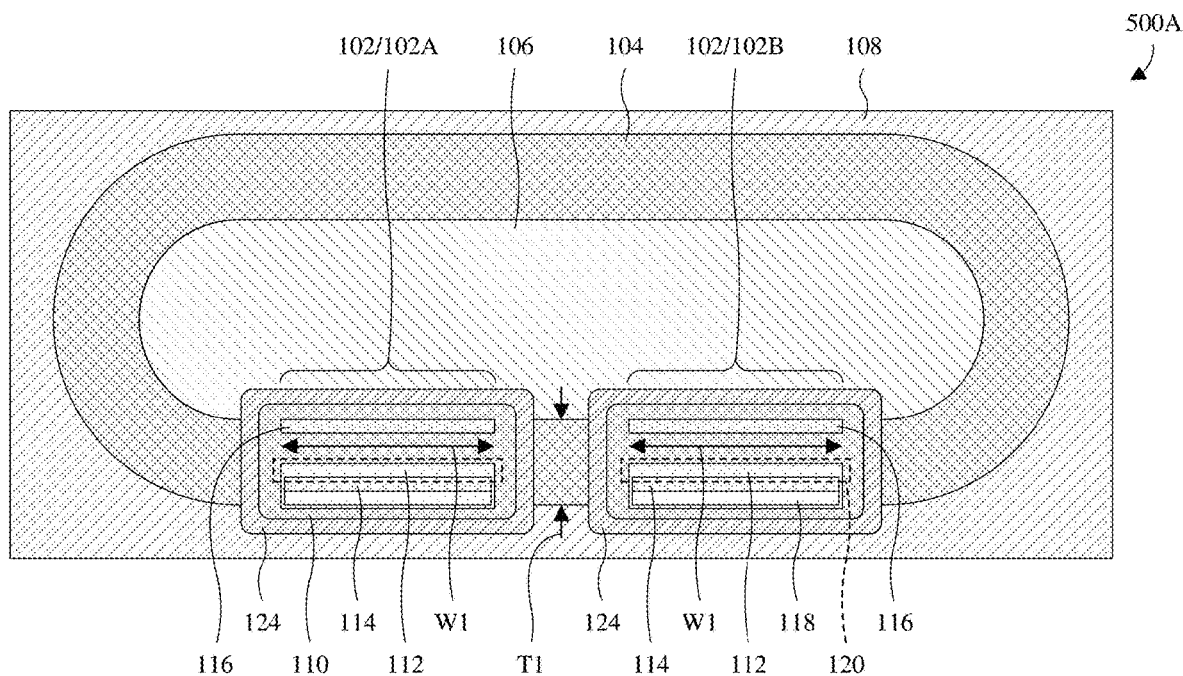
FIGS. 5A-5D illustrate top layouts of various embodiments of the IC of FIG. 1 in which a geometry of the HVMOS device is varied.
Figure 5B:
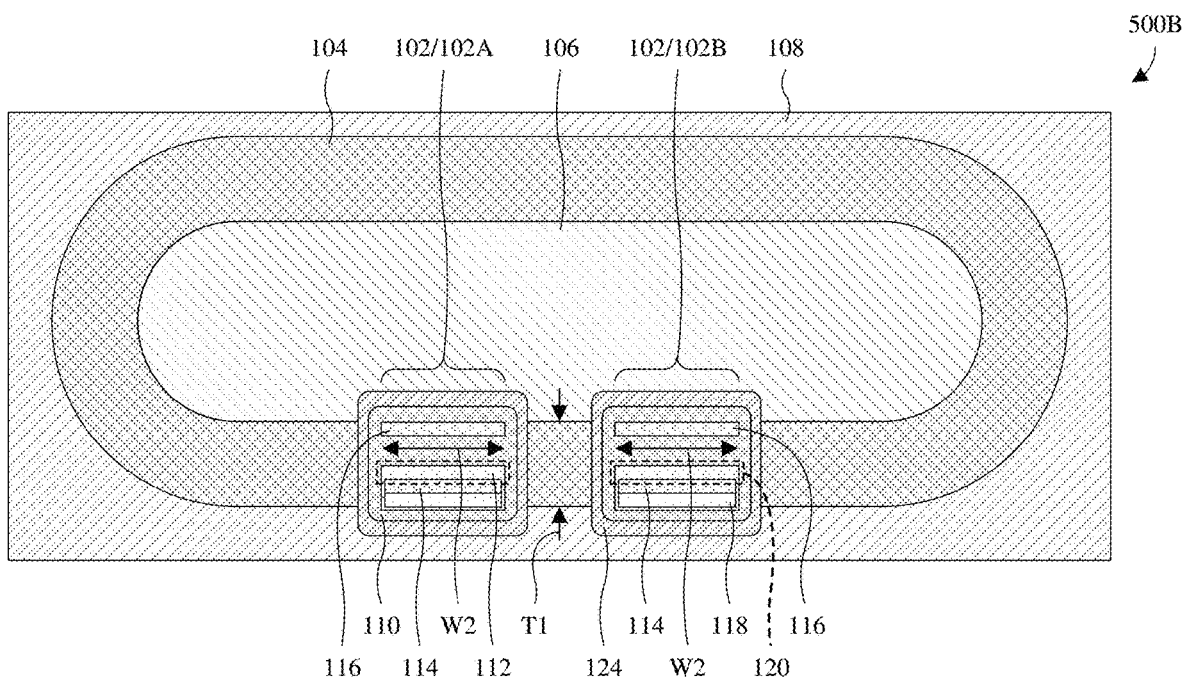

As illustrated by FIGS. 5A and 5B, the HVMOS devices 102 of FIG. 5A have a first width W1, whereas the HVMOS devices 102 of FIG. 5B have a second width W2 less than the first width W1. Increasing a width of the HVMOS devices 102 increases a width of the first and second source/drain regions 114, 116, which widens selectively-conductive channels of the HVMOS devices 102 and widens the HVMOS drift wells 110. This increases the source-drain current at which the HVMOS device 102 can sustain operation. Further, decreasing a width of the HVMOS devices 102 decreases a width of the first and second source/drain regions 114, 116, which narrows selectively-conductive channels of the HVMOS devices 102 and narrows the HVMOS drift wells 110. This decreases the source-drain current at which the HVMOS devices 102 can sustain operation. Therefore, because the first width W1 is greater than the second width W2, the HVMOS devices 102 of FIG. 5A can sustain operation at a higher source-drain current than the HVMOS devices 102 of FIG. 5B.

Figure 5C:
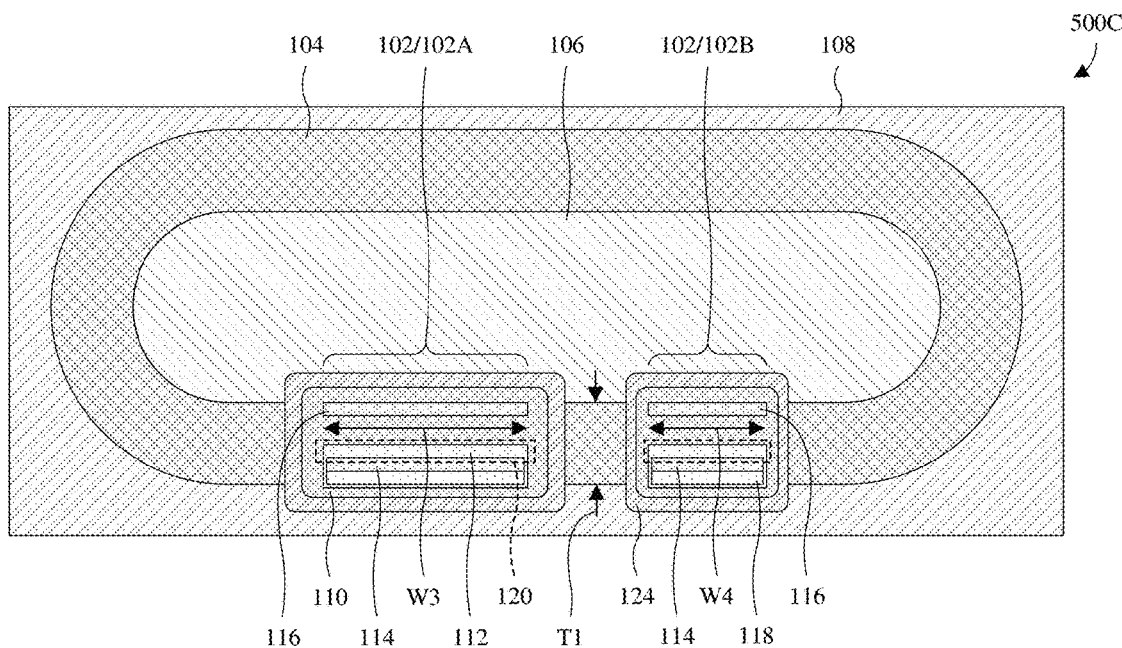

As illustrated by FIG. 5C, the first and second HVMOS devices 102A, 102B respectively have a third width W3 and a fourth width W4, where the fourth width W4 is less than the third width W3. Therefore, the first HVMOS device 102A of FIG. 5C can sustain operation at a higher source-drain current than the second HVMOS device 102B of FIG. 5C.

Figure 5D:
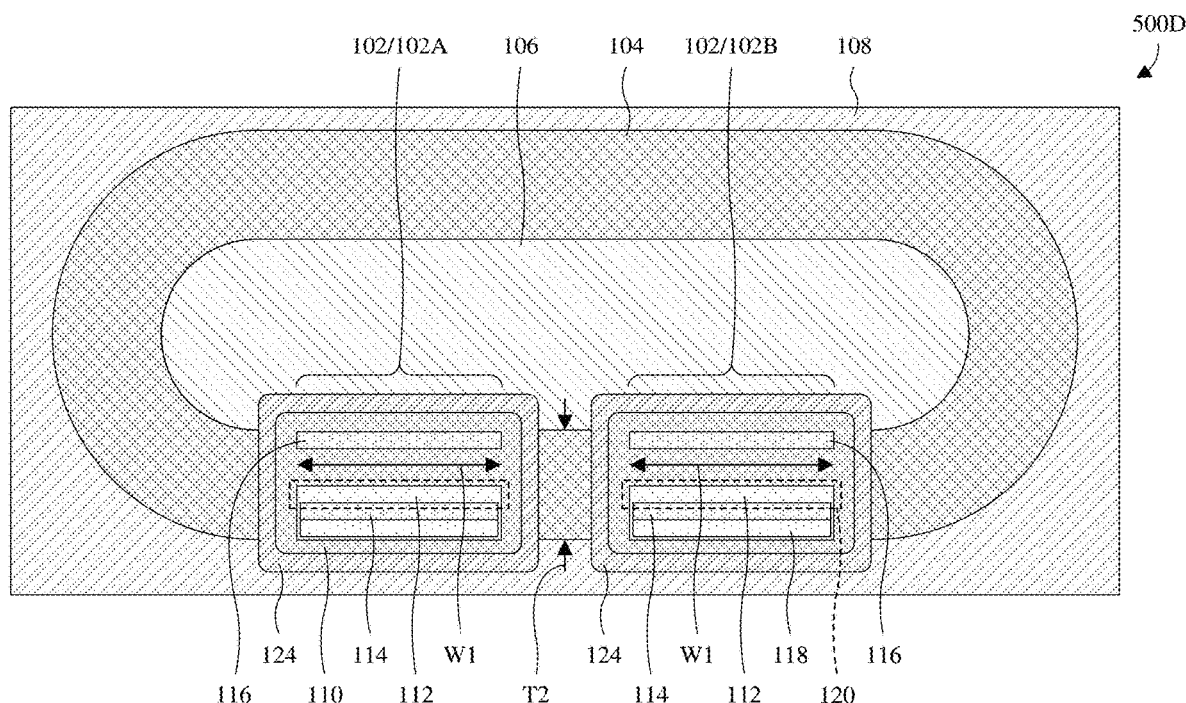

As illustrated by FIGS. 5A-5D, the HVMOS devices 102 of FIGS. 5A-5C and the HVJT device 104 of FIGS. 5A-5C have a first thickness T1, whereas the HVMOS devices 102 of FIG. 5D and the HVJT device 104 of FIG. 5D have a second thickness T2 greater than the first thickness T1. Increasing a thickness of the HVMOS devices 102 lengthens the HVMOS drift wells 110 of the HVMOS devices 102, which increases the voltages at which the HVMOS devices 102 can sustain operation. Similarly, increasing a thickness of the HVJT device 104 lengthens the HVJT drift well (not shown), which increases the voltage at which the HVJT device 104 can sustain operation. Decreasing a thickness of an HVMOS devices 102 shortens the HVMOS drift wells 110, which decreases the voltages at which the HVMOS devices 102 can sustain operation. Similarly, decreasing a thickness of the HVJT device 104 shortens the HVJT drift well, which decreases the voltage at which the HVJT device 104 can sustain operation. Therefore, since the first thickness T1 is less than the second thickness T2, the HVMOS devices 102 of FIG. 5D can sustain operation at higher voltages than the HVMOS devices 102 of the FIGS. 5A-5C. Further, the HVJT device 104 of FIG. 5D can sustain operation at a higher voltage than the HVJT device 104 of FIGS. 5A-5C.

Because the isolation rings 124 facilitate efficient integration between the HVJT device 104 and the HVMOS devices 102, the geometries of the HVMOS devices 102 and the HVJT device 104 may be readily scaled without complex redesigns by adjusting the size of the isolation rings 124.

Figure 6A:
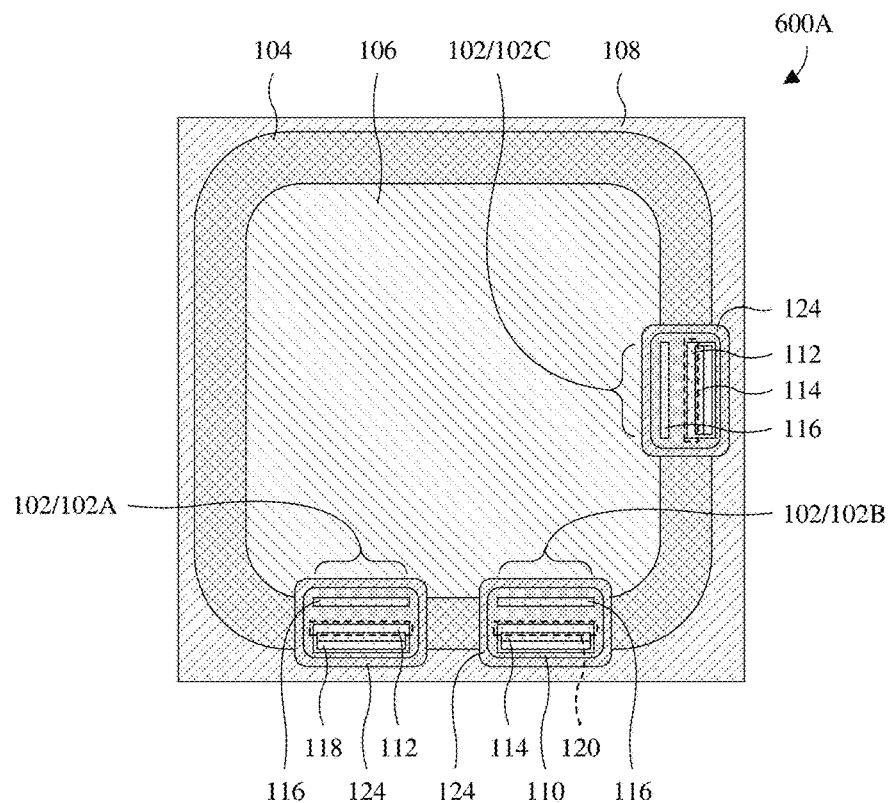
FIGS. 6A and 6B illustrate top layouts of various other embodiments of the IC of FIG. 1 in which more than two HVMOS devices are integrated with the HVJT device.
Figure 6B:
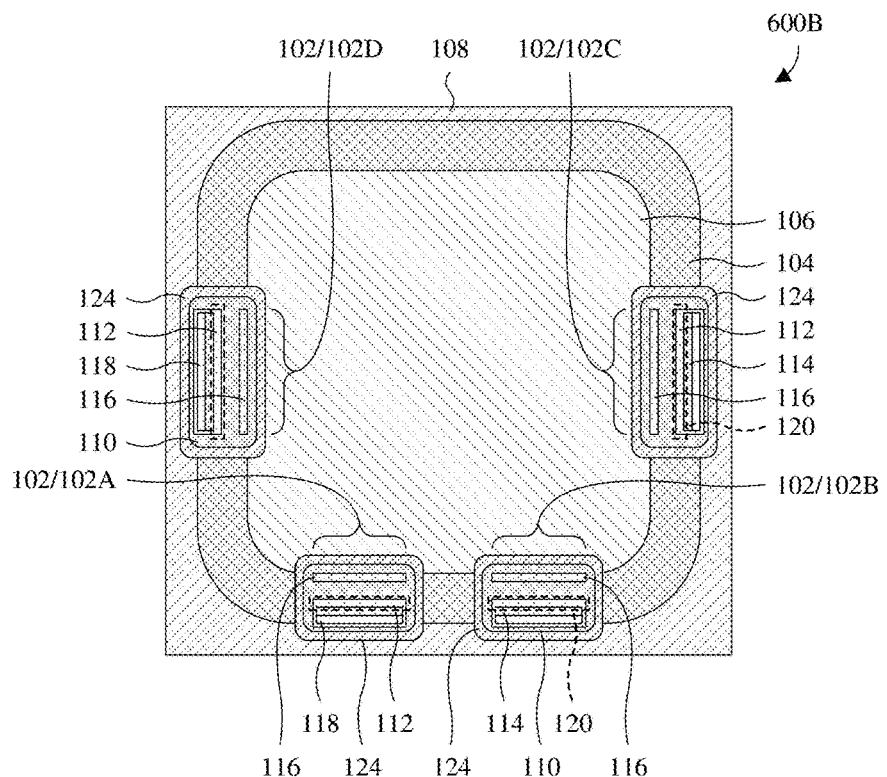

With reference to FIGS. 6A and 6B, top layouts 600A, 600B of various other embodiments of the IC of FIG. 1 are provided in which more than two HVMOS devices are integrated with the HVJT device 104. As illustrated by FIG. 6A, the HVMOS devices 102 further comprise a third HVMOS device 102C. As illustrated by FIG. 6B, the HVMOS devices 102 further comprise the third HVMOS device 102C and a fourth HVMOS device 102D. Each of the HVMOS devices 102 is as described in FIG. 1 and may, for example, be as the first HVMOS device 102A is illustrated and described in any one of FIGS. 2A, 2B, 3A, and 3B.

Because the isolation rings 124 facilitate efficient integration between the HVJT device 104 and the HVMOS devices 102, the number of HVMOS devices integrated with the HVJT device 104 may be varied without complex redesigns. Further, because the HVJT device 104 and the HVMOS devices 102 are integrated together, the number of HVMOS devices integrated with the HVJT device 104 may be increased without increasing IC chip area.

Figure 7:
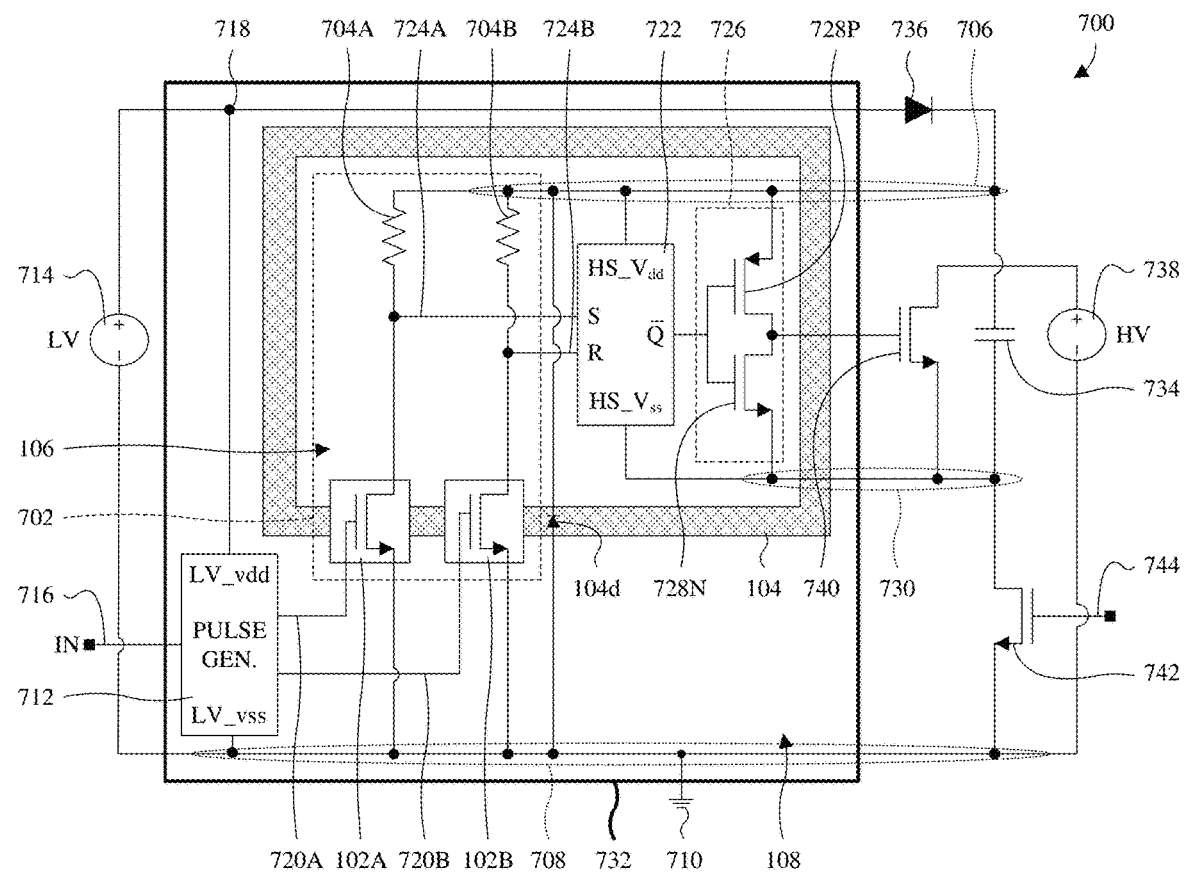
FIG. 7 illustrates a block diagram of some embodiments a circuit in which the IC of FIG. 1 finds application.

With reference to FIG. 7, a block diagram 700 of some embodiments of a circuit in which the IC of FIG. 1 finds application. The circuit may, for example, be or comprise a high-side gate driver circuit. As illustrated, a level shifter 702 comprises the first HVMOS device 102A and the second HVMOS device 102B, and further comprises a first resistor 704A and a second resistor 704B. In some embodiments, the first and second HVMOS devices 102A, 102B are n-channel LDMOS transistors. The first HVMOS device 102A and the first resistor 704A are electrically coupled in series from a high side supply node 706 (e.g., HS_Vdd) to a low voltage return node 708 (e.g., LV_Vss), such that the first HVMOS device 102A is separated from the high side supply node 706 by the first resistor 704A. Similarly, the second HVMOS device 102B and the second resistor 704B are electrically coupled in series from the high side supply node 706 to the low voltage return node 708, such that the second HVMOS device 102B is separated from the high side supply node 706 by the second resistor 704B. In some embodiments, the low voltage return node 708 is electrically coupled to ground 710.

An edge pulse generator 712 is powered by a low voltage power supply 714, and controls gates of the first and second HVMOS devices 102A, 102B based on a high side input signal 716. The high side input signal 716 is a binary signal varying between 0 volts and a voltage of the low voltage power supply 714. The low voltage power supply 714 has an anode electrically coupled to a low voltage supply node 718 (e.g., LV_$V_{dd}$), and a cathode electrically coupled to the low voltage return node 708. The low voltage power supply 714 may be, for example, a direct current (DC) power supply, and/or may, for example, supply a low voltage between about 1-20 volts, between about 1-10 volts, between about 10-20 volts, or less than about 20 volts. The edge pulse generator 712 detects rising edges of the high side input signal 716, and further detects falling edges of the high side input signal 716. Further, the edge pulse generator 712 generates a rising-edge signal 720A and a falling-edge signal 720B. The rising-edge signal 720A has a pulse at each of the detected rising edges and gates the first HVMOS device 102A. The falling-edge signal 710B has a pulse at each of the detected falling edges and gates the second HVMOS device 102B.

A set-reset (S-R) latch 722 is set by a set signal 724A at a shared node of the first HVMOS device 102A and the first resistor 704A, and is further reset by a reset signal 724B at a shared node of the second HVMOS device 102B and the second resistor 704B. In some embodiments, the set and reset signals 724A, 724B pass through a noise filter (not shown) before passing to the S-R latch 722. An inverted output (e.g., $\overline{Q}$) of the S-R latch 722 controls a gate driver 726 to selectively switch the gate driver 726 between an ON state and an OFF state. For example, the gate driver 726 may be in an ON state when the inverted output of the S-R latch 722 indicates a binary "0" and may be in an OFF state when the inverted output of the S-R latch 722 indicates a binary "1". In some embodiments, the gate driver 726 is or comprises a complementary metal-oxide-semiconductor (CMOS) inverter. In some embodiments, the gate driver 726 comprises a p-channel MOS field-effect transistor (MOSFET) 728P and an n-channel MOSFET 728N connected in series from the high side supply node 706 to a high side return (e.g., HS_$V_{ss}$) node 730, such that the p-channel MOSFET 728P separates the n-channel MOSFET 728N from the high side supply node 706.

The HVJT device 104 and the first and second HVMOS devices 102A, 102B collectively define a composite structure extending laterally along a boundary of a high side area 106 of an IC die 732 to surround the high side area 106. In some embodiments, the composite structure is square ring shaped, rectangular ring shaped, triangular ring shaped, circular ring shaped, or some other closed path shape. Further, the composite structure is surrounded by a low voltage area 108 of the IC die 732. The high side area 106 accommodates the S-R latch 722, the gate driver 726, the first resistor 704A, and the second resistor 704B, whereas the low voltage area 108 accommodates the edge pulse generator 712. The HVJT device 104 is or comprises a diode 104d and electrically separates the low voltage area 108 from the high side area 106. In some embodiments, a cathode of the diode 104d is electrically coupled to the high side supply node 706, and/or an anode of the diode 104d is electrically coupled to the low voltage return node 708.

A bootstrap capacitor 734 is electrically coupled from the high side supply node 706 to the high side return node 730. The bootstrap capacitor 734 is charged by the low voltage power supply 714, through a bootstrap diode 736, while the gate driver 726 is in the OFF state. Further, the bootstrap capacitor 734 powers devices (e.g., the S-R latch 722) at the high side area 106 to change the gate driver 726 to the ON state. A high side power supply 738 is electrically coupled to the low voltage return node 708, and is selectively electrically coupled to the high side return node 730 by a first power MOSFET 740. Note that an insulated-gate bipolar transistor (IGBT) or some other switching device may alternatively be used in place of the first power MOSFET 740. The high side power supply 738 may be, for example, a DC power supply, and/or may, for example, supply a high voltage between about 300-1200 volts, between about 300-750 volts, between about 750-1200 volts, between about 550-650 volts, or in excess of 300 volts. The first power MOSFET 740 is gated by an output of the gate driver 726 and may be, for example, an n-channel power MOSFET. In some embodiments, the output of the gate driver 726 is at a node shared by the p-channel MOSFET 728P and the n-channel MOSFET 728N.

The bootstrap diode 736 limits the flow of current between the low voltage supply node 714 and the high side supply node 706. The bootstrap diode 736 allows current to flow from the low voltage supply node 718 to the high side supply node 706 while the high side supply node 706 is at a lower voltage level than the low voltage supply node 718. This may occur while the gate driver 726 is in the OFF state and allows the bootstrap capacitor 734 to be charged. Further, the bootstrap diode 736 blocks current from flowing between the low voltage supply node 718 and the high side supply node 706 while the high side supply node 706 is at a higher voltage level than the low voltage supply node 718. This may occur while the gate driver 726 is in the ON state and prevents devices at the low voltage area 108 from being damaged by high voltages of the high side power supply 738.

In operation, to disable the first power MOSFET 740, the high side input signal 716 is changed from a binary "1" to a binary "0", thereby resetting the S-R latch 722. After resetting the S-R latch 722, the S-R latch 722 outputs a binary "1" at the inverted output, which disables the p-channel MOSFET 728P and enables the n-channel MOSFET 728N. This electrically shorts the gate of the first power MOSFET 740 and the source of the first power MOSFET 740, thereby disabling the first power MOSFET 740. Additionally, the high side return node 730 is electrically coupled to the low voltage return node 708. In some embodiments, this electrical coupling is performed by a second power MOSFET 742 or some other switching device. The second power MOSFET 742 is gated by a low-side input signal 744, which may, for example, be generated by a low-side gate driver circuit. Since the bootstrap capacitor 734 has largely been discharged and the high side return node 730 is electrically coupled to the low voltage return node 708, the voltage at the high side supply node 706 is low compared to the voltage of the low voltage supply node 718. Therefore, the bootstrap diode 736 is operating in a forward biased state and allows the flow of current between the low voltage supply node 718 and the high side supply node 706. This, in turn, charges the bootstrap capacitor 734 from the low voltage power supply 714.

To enable the first power MOSFET 740, the high side return node 730 is electrically separated from the low voltage return node 708, such that the high side return node 730 is floating. In some embodiments, this electrical separation is performed by the second power MOSFET 742. The high side return node 730 floats upward, whereby the bootstrap diode 736 moves to a reverse biased state. Further, the high side input signal 716 is changed from a binary "0" to a binary "1". This change sets the S-R latch 722, such that the inverted output of the S-R latch 722 is at a binary "0". The inverted output enables the p-channel MOSFET 728P and enables the n-channel MOSFET 728N, which electrically couples the bootstrap capacitor 734 from the gate of the first power MOSFET 740 to the source of the first power MOSFET 740. Charge accumulated in the bootstrap capacitor 734 enables the first power MOSFET 740, which electrically couples the high side power supply 738 to the high side return node 730. This changes a voltage at the high side supply node 706 to the voltage of the high side power supply 738 plus the voltage across the bootstrap capacitor 734.

With reference to FIGS. 8-13, a series of cross-sectional views 800-1300 of some embodiments of a method for forming an IC in which a HVMOS device is integrated with a HVJT device is provided. The IC may, for example, be as illustrated and described with respect to FIGS. 1, 2A, 2B, 3A, and 3B, and/or the cross-sectional views 800-1300 may, for example, be taken along line A-A' in FIGS. 1, 3A, and 3B.

Figure 8:
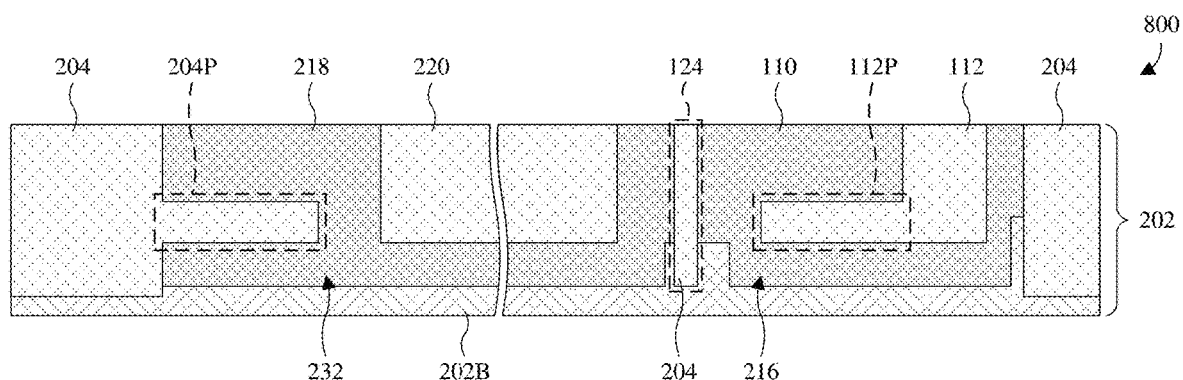
FIGS. 8-13 illustrate a series of cross-sectional views of some embodiments of a method for forming an IC in which a HVMOS device is integrated with a HVJT device.

As illustrated by the cross-sectional view 800 of FIG. 8, a series of doping processes are performed to form a high side well 220, a peripheral well 204, an HVJT drift well 218, an HVMOS drift well 110, and an HVMOS body well 112 in a semiconductor substrate 202. The semiconductor substrate 202 may be, for example, a bulk silicon substrate, a group III-V substrate, a SOI substrate, or some other semiconductor substrate.

The peripheral well 204 overlies a bulk semiconductor region 202B of the semiconductor substrate 202, and comprises a pair of segments between which the high side well 220, the HVJT drift well 218, the HVMOS drift well 110, and the HVMOS body well 112 are sandwiched. Further, the peripheral well 204 comprises an isolation ring 124 and a protrusion 204P. The isolation ring 124 provides electrical and physical separation between the HVJT drift well 218 and the HVMOS drift well 110. When viewed top down, the isolation ring 124 may be square ring shaped, rectangular ring shaped, triangular ring shaped, circular ring shaped, or some other closed path shape. The protrusion 204P protrudes laterally into the HVJT drift well 218, towards the high side well 220, thereby leading to an HVJT RESURF structure 232. The HVJT RESURF structure 232 enables the HVJT device under manufacture to sustain operation at high voltages. In some embodiments, the peripheral well 204 and the bulk semiconductor region 202B have the same doping type, such as, for example, p-type. In some embodiments, the peripheral well 204 is continuous. For example, the various segments of the peripheral well 204 may be connected outside the cross-sectional view 800 of FIG. 8. See, for example, FIG. 3B.

The HVJT drift well 218 underlies and laterally surrounds the high side well 220 to completely separate the high side well 220 from the peripheral well 204 and the bulk semiconductor region 202B. The HVJT drift well 218 and the peripheral well 204 have opposite doping types and partially define the HVJT device under manufacture. Namely, the HVJT device under manufacture is or comprises a diode, and the HVJT drift well 218 and the peripheral well 204 define a PN junction of the diode. In some embodiments, the HVJT drift well also has an opposite doping type as the high side well 220, and/or has the same doping type as the HVMOS drift well 110.

The HVMOS drift well 110 underlies and laterally surrounds the HVMOS body well 112 to completely separate the HVMOS body well 112 from the peripheral well 204 and the bulk semiconductor region 202B. The HVMOS drift well 110 has an opposite doping type as the peripheral well 204 and the HVMOS body well 112. Further, in some embodiments, the HVMOS drift well 110 has the same doping type as the HVJT drift well 218. The HVMOS drift well 110 and the HVMOS body well 112 support the HVMOS device under manufacture. The HVMOS body well 112 comprises a protrusion 112P protruding laterally into the HVMOS drift well 110, towards the high side well 220, thereby leading to an HVMOS RESURF structure 216.

The HVMOS RESURF structure 216 enables the HVMOS device under manufacture to sustain operation at high voltages.

The doping processes of FIG. 8 may, for example, be performed by ion implantation and/or some other doping processes. In some embodiments, the doping processes comprise n-type doping processes and p-type doping processes. The n-type doping processes are performed to form n-type wells, and the p-type doping processes are performed to form p-type wells. The p-type wells may, for example, include the peripheral well 204, the high side well 220, and the HVMOS body well 112, and the n-type wells may, for example, include the HVJT drift well 218 and the HVMOS drift well 110, or vice versa. In some embodiments, some or all of the n-type and p-type doping processes is/are each performed by forming a mask with a pattern over the semiconductor substrate 202, performing ion implantation into the semiconductor substrate 202 with the mask in place, and removing the mask. The mask may, for example, have a pattern of the one or more wells being formed by the ion implantation, and may, for example, be photoresist, silicon nitride, or some other material.

Figure 9:
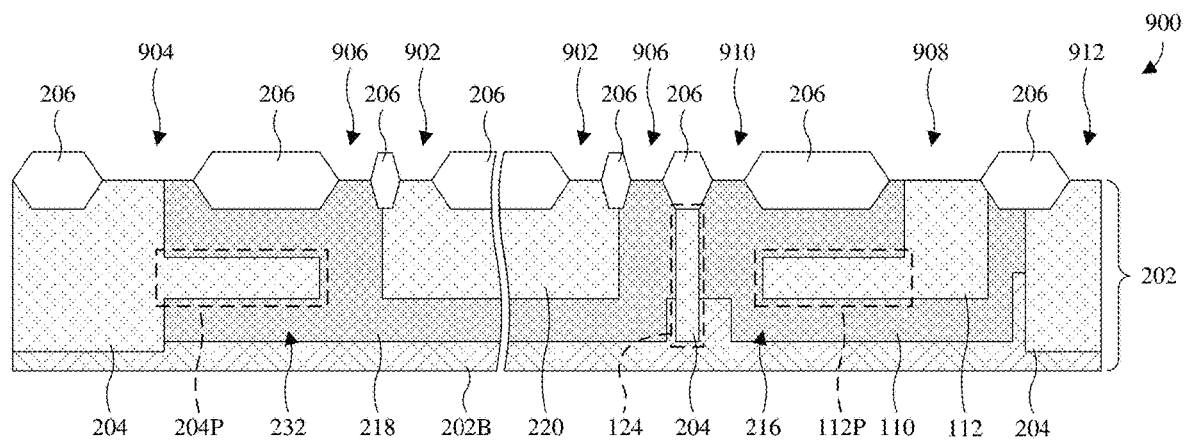

As illustrated by the cross-sectional view 900 of FIG. 9, an isolation structure 206 is formed over the semiconductor substrate 202, demarcating boundaries for doped regions (e.g., contact regions and/or source/drain regions) to be formed hereafter. The isolation structure 206 comprises a dielectric material (e.g., silicon oxide), and may be or comprise, for example, a STI structure, a FOX structure, a LOCOS structure, or some other isolation structure.

Overlying the high side well 220, the isolation structure 206 defines a high side opening 902. The high side opening 902 is on opposite sides of the high side well 220 and may, for example, have a ring-shaped top layout. Overlying a boundary at which the peripheral well 204 contacts the HVJT drift well 218, the isolation structure 206 defines a low-side HVJT opening 904. Overlying the HVJT drift well 218 and adjacent to the high side well 220, the isolation structure 206 defines a high-side HVJT opening 906. The high-side HVJT opening 906 is on opposite sides of the high side well 220 and may, for example, have a ring-shaped top layout. As used herein with respect to the high side opening 902 and the high-side HVJT opening 906, ring-shaped may be circular ring shaped, square ring shaped, rectangular ring shaped, triangular ring shaped, or some other closed path shape. Overlying a boundary at which the HVMOS body well 112 contacts the HVMOS drift well 110, the isolation structure 206 defines a low-side HVMOS opening 908. Overlying the HVMOS drift well 110 and adjacent to the isolation ring 124, the isolation structure 206 defines a high-side HVMOS opening 910. Overlying the peripheral well 204 and adjacent to the HVMOS drift well 110, the isolation structure 206 defines a peripheral opening 912.

In some embodiments, a process for forming the isolation structure 206 comprises forming a mask (not shown) covering the semiconductor substrate 202 and having a layout of the isolation structure 206. The mask may, for example, be silicon nitride, photoresist, or some other suitable mask material. An oxidation process is then performed with mask in place to form the isolation structure 206, and the mask is subsequently removed.

Figure 10:
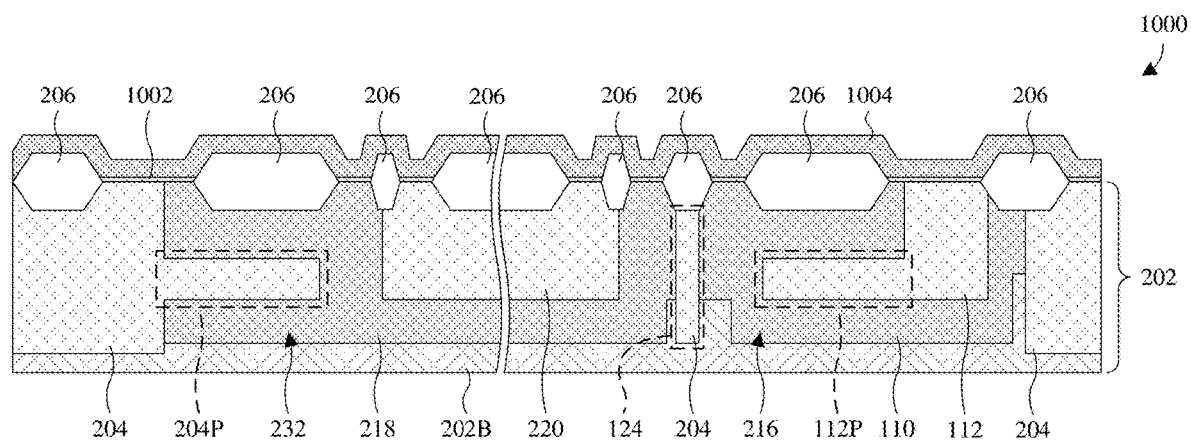

As illustrated by the cross-sectional view 1000 of FIG. 10, a dielectric layer 1002 and a conductive layer 1004 are formed stacked over the semiconductor substrate 202 and the isolation structure 206. The dielectric layer 1002 may be or comprise, for example, silicon oxide, hafnium oxide, or some other dielectric, and/or the conductive layer 1004 may be or comprise, for example, doped polysilicon, metal, or some other conductive material. In some embodiments, the dielectric layer 1002 is formed by thermal oxidation, chemical vapor deposition (CVD), physical vapor deposition (PVD), some other deposition or oxidation process, or any combination of the foregoing. In some embodiments, the conductive layer 1004 is formed by CVD, PVD, electroless plating, electroplating, some other deposition or plating process, or any combination of the foregoing.

Figure 11:
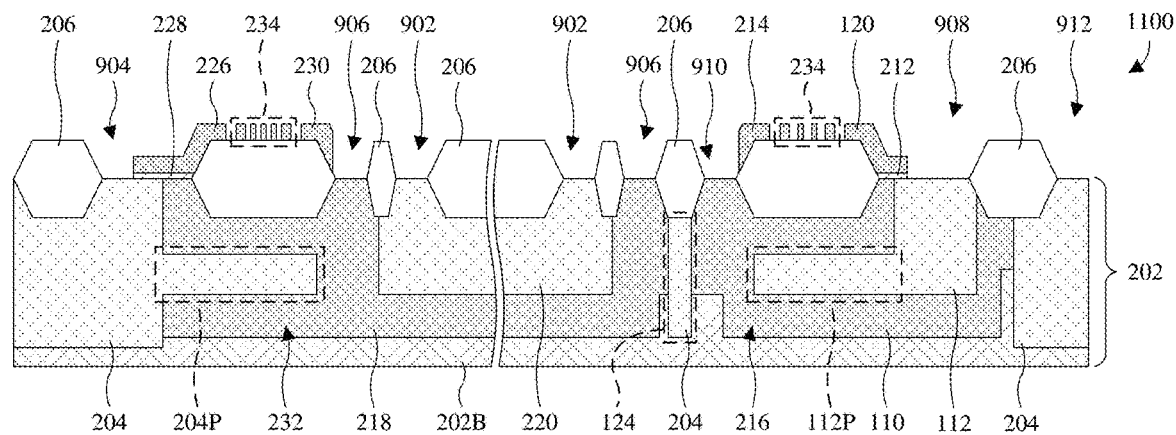

As illustrated by the cross-sectional view 1100 of FIG. 11, the dielectric layer 1002 (see FIG. 10) and the conductive layer 1004 (see FIG. 10) are patterned. Overlying the HVMOS drift well 110, the patterning forms a gate electrode 120 and a gate dielectric layer 212 stacked in the low-side HVMOS opening 908 and lining a sidewall of the isolation structure 206. Further, the patterning forms an HVMOS field plate 214 in the high-side HVMOS opening 910 and lining a sidewall of the isolation structure 206. Overlying the HVJT drift well 218, the patterning forms a first HVJT field plate 226 and a field plate dielectric layer 228 stacked in the low-side HVJT opening 904 and lining a sidewall of the isolation structure 206. Further, the patterning forms a second HVJT field plate 230 in the high-side HVJT opening 906 and lining a sidewall of the isolation structure 206.

In some embodiments, a process for performing the patterning comprises forming a mask overlying the conductive layer 1004, and subsequently performing an etch into the conductive layer 1004 and the dielectric layer 1002 with the mask in place. The mask is thereafter be removed and may, for example, be or comprise photoresist, silicon nitride, some other mask material, or any combination of the foregoing.

In some embodiments, the patterning of the conductive layer 1004 also forms a spiral structure 234 overlying both the HVMOS drift well 110 and the HVMOS drift well 218. In other embodiments, the spiral structure 234 is formed independent of the conductive layer 1004 and/or the patterning of the conductive layer 1004. For example, a second conductive layer (not shown) may be formed and subsequently patterned into the spiral structure 234. The second conductive layer may, for example, be a different material than the conductive layer 1004 and/or may, for example, be metal, doped polysilicon, or some other conductive material. Further, the second conductive layer may, for example, be formed by CVD, PVD, electroless plating, electroplating, some other deposition or plating process, or any combination of the foregoing. The patterning of the second conductive layer may, for example, be performed by photolithography and/or as the patterning of the conductive layer 1004 is described above.

Figure 12:
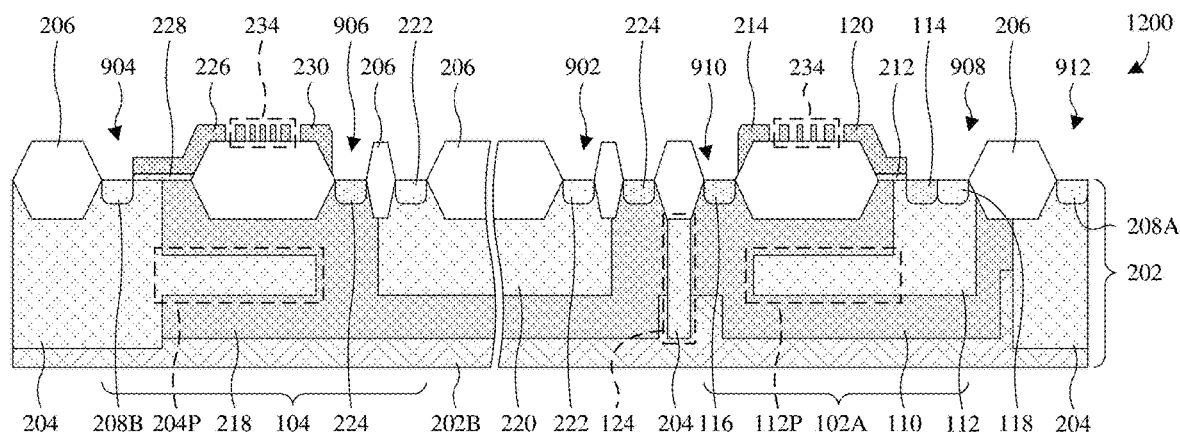

As illustrated by the cross-sectional view 1200 of FIG. 12, a series of doping processes is performed to form contact regions and source/drain regions in the semiconductor substrate 202. A first peripheral contact region 208A is formed overlying the peripheral well 204, through the peripheral opening 912. The first peripheral contact region 208A has the same doping type as, but a higher doping concentration than, the peripheral well 204. A high side contact region 222 is formed overlying the high side well 220, through the high side opening 902. The high side contact region 222 has the same doping type as, but a higher doping concentration than, the high side well 220.

A first source/drain region 114 and a body contact region 118 are formed overlying the HVMOS body well 112, through the low-side HVMOS opening 908. A second source/drain region 116 is formed overlying the HVMOS drift well 110, through the high-side HVMOS opening 910.

The first and second source/drain regions 114, 116, the body contact region 118, the gate electrode 120, and the HVMOS field plate 214 at least partially define an HVMOS device 102A on the HVMOS body well 112 and the HVMOS drift well 110.

A second peripheral contact region 208B is formed overlying the peripheral well 204, through the low-side HVJT opening 904. A HVJT drift contact region 224 is formed overlying the HVJT drift well 218, through the high-side HVJT opening 906. The peripheral well 204, the HVJT drift well 218, the first and second HVJT field plates 226, 228, the second peripheral contact region 208B, and the HVJT drift contact region 224 at least partially define an HVJT device 104. In some embodiments, the spiral structure 234 overlies both the HVJT device 104 and the HVMOS device 102 and serves as a field plate for both of the HVJT device 104 and the HVMOS device 102.

The doping processes of FIG. 12 may, for example, be performed by ion implantation and/or some other doping processes. In some embodiments, the doping processes comprise an n-type doping process and a p-type doping process. In some embodiments, each of the doping processes is performed by forming a mask with a pattern over the semiconductor substrate 202, performing ion implantation into the semiconductor substrate 202 with the mask in place, and removing the mask. The mask may, for example, have a pattern of the one or more contact and/or source/drain regions being formed by the ion implantation, and may, for example, be photoresist, silicon nitride, or some other material.

Figure 13:
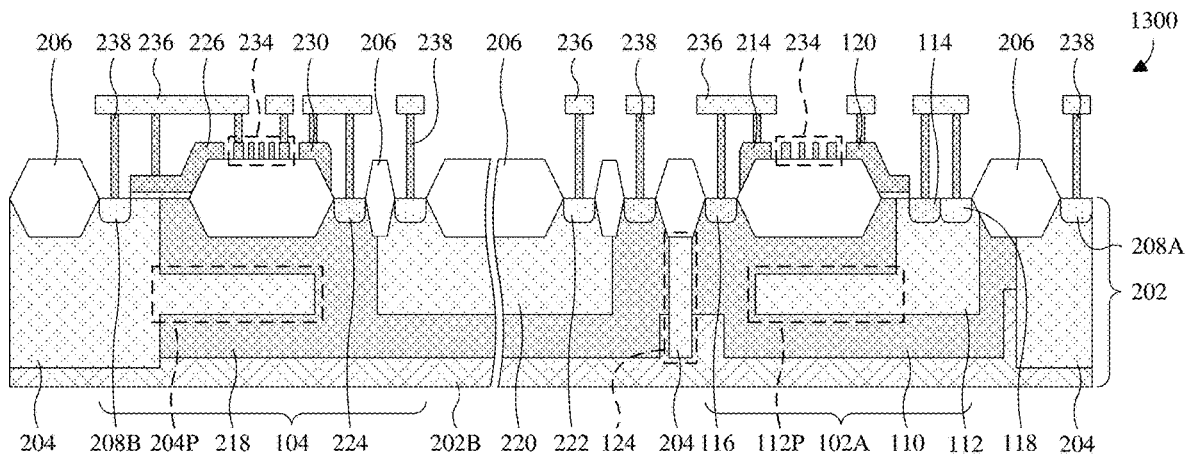

As illustrated by the cross-sectional view 1300 of FIG. 13, a back-end-of-line (BEOL) metallization process is performed to form a plurality of conductive wires 236 and a plurality of conductive vias 238 stacked over the semiconductor substrate 202. For ease of illustration, only some of the conductive wires 236 are labeled 236, and only some of the conductive vias 238 are labeled 238. The conductive wires 236 and the conducive vias 238 define conductive paths interconnecting the first and second source/drain regions 114, 116, the various contact regions (e.g., the high side contact region 222), the various field plates (e.g., the second HVJT field plate 230), the gate electrode 120, and the spiral structure 234. The conductive wires 236 and the conductive vias 238 may be or comprise, for example, copper, aluminum copper, aluminum, tungsten, some other conductive material, or any combination of the foregoing.

In some embodiments, the conductive vias 238 are formed by forming an interlayer dielectric (ILD) layer (not shown) covering the structure of FIG. 12, performing a planarization into a top surface of the ILD layer, and patterning the ILD layer to define via openings corresponding to the conductive vias 238. The ILD layer is covered with a conductive layer (not shown) and the via openings are filled with the conductive layer. A planarization is performed into a top surface of the conductive layer until the top surface of the conductive layer is about even with the top surface of the ILD layer, thereby forming the conductive vias 238 from the conductive layer. The above described process for forming the conductive vias 238 is then repeated for the conductive wires 236.

Figure 14:
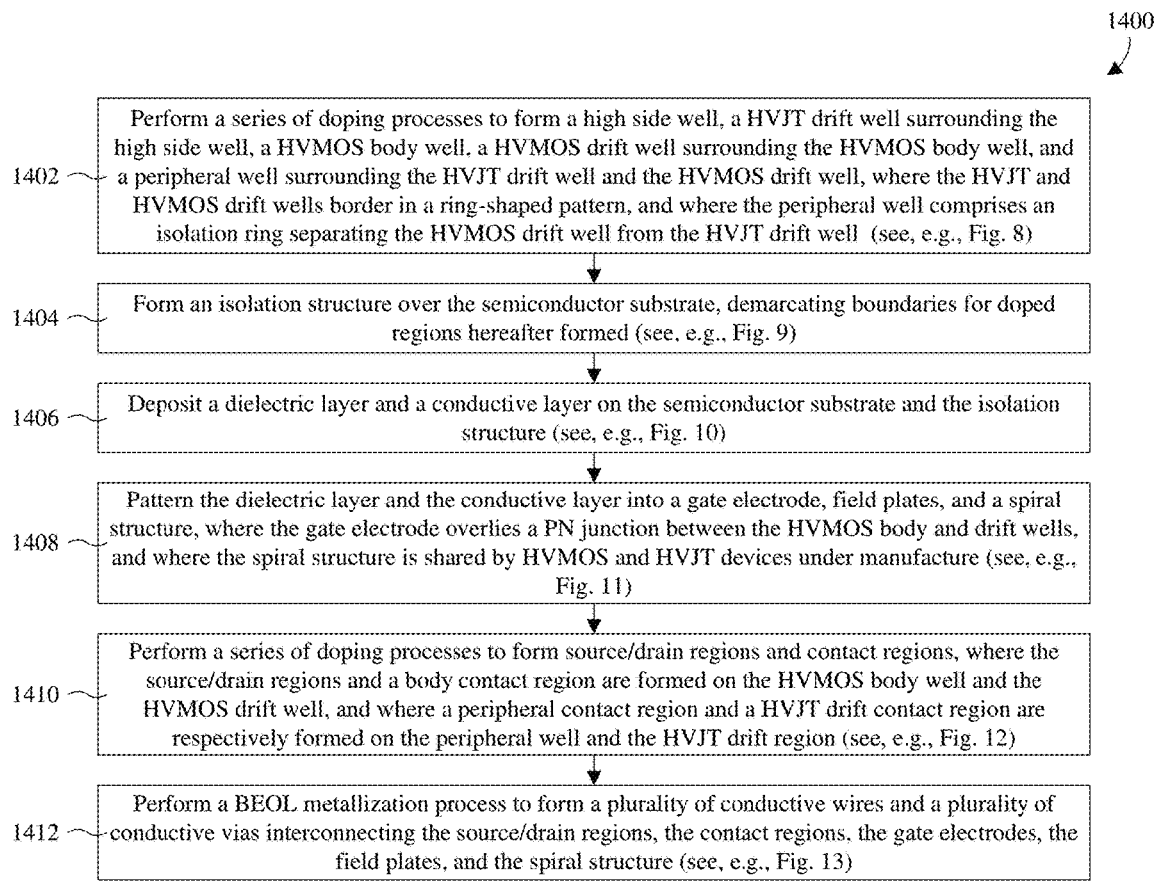
FIG. 14 illustrates a flowchart of some embodiments of the method of FIGS. 8-13.

With reference to FIG. 14, a flowchart 1400 of some embodiments of the method of FIGS. 8-13 is provided.

At step 1402, a series of doping processes are performed to form a high side well, a HVJT drift well surrounding the high side well, a HVMOS body well, a HVMOS drift well surrounding the HVMOS body well, and a peripheral well surrounding the HVJT drift well and the HVMOS drift well, where the HVJT and HVMOS drift wells border in a ring-shaped pattern, and where the peripheral well comprises an isolation ring separating the HVMOS drift well from the HVJT drift well. See, for example, FIG. 8.

At step 1404, an isolation structure is formed over the semiconductor substrate, demarcating boundaries for doped regions to be formed hereafter. See, for example, FIG. 9. The doped regions include, for example, contact regions and source/drain regions.

At step 1406, a dielectric layer and a conductive layer are deposited on the semiconductor substrate and the isolation structure. See, for example, FIG. 10.

At step 1408, the dielectric layer and the conductive layer are patterned into a gate electrode, field plates, and a spiral structure, wherein the gate electrode overlies a PN junction between the HVMOS body and drift wells, and where the spiral structure is shared by HVMOS and HVJT devices under manufacture. See, for example, FIG. 11.

At step 1410, a series of doping processes is performed to form source/drain regions and contact regions, where the source/drain regions and a body contact region are formed on the HVMOS body well and the HVMOS drift well, and where a peripheral contact region and a HVJT drift contact region are respectively formed on the peripheral well and the HVJT drift well. See, for example, FIG. 12. The source/drain regions, the body contact region and the gate electrode at least partially define an HVMOS device on the HVMOS drift well and the HVMOS body well. The peripheral contact region, the HVJT drift contact region, the HVJT drift well, and the peripheral well at least partially define an HVJT device.

At step 1412, a BEOL metallization process is performed to form a plurality of conductive wires and a plurality of conductive vias interconnecting the source/drain regions, the contact regions, the gate electrodes, the field plates, and the spiral structure. See, for example, FIG. 13.

While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated circuit including: a substrate; a first drift well and a second drift well in the substrate, wherein the first and second drift wells border in a ring-shaped pattern and have a first doping type; a peripheral well in the substrate and having a second doping type, wherein the peripheral well surrounds and separates the first and second drift wells, and wherein the second doping type is opposite the first doping type; a body well in the substrate and having the second doping type, wherein the body well overlies the first drift well and is spaced from the peripheral well by the first drift well; and a gate electrode overlying a junction between the first drift well and the body well. In some embodiments, the integrated circuit further includes a high side well in the substrate and having the second doping type, wherein the high side well overlies the second drift well and is spaced from the peripheral well by the second drift well. In some embodiments, the integrated circuit further includes a high side contact region overlying the high side well, wherein the high side contact region extends laterally along a periphery of the high side well in a closed path, and wherein the high side contact region has the same doping type as, but a higher doping concentration than, the high side well. In some embodiments, the integrated circuit further includes a drift contact region overlying the second drift well, wherein the drift extends laterally along a periphery of the high side well in a closed path to completely enclose the high side well, wherein the drift contact region has the same doping type as, but a higher doping concentration than, the second drift well, and wherein the drift contact region separates the high side well from the first drift well. In some embodiments, the substrate includes a bulk semiconductor region having the second doping type, wherein the first and second drift wells and the peripheral well overlie the bulk semiconductor region. In some embodiments, the integrated circuit further includes a first source/drain region and a second source/drain region, wherein the first and second source/drain regions respectively overlie the body well and the first drift well, and wherein the first and second source/drain regions are separated by the body well and the first drift well. In some embodiments, the integrated circuit the body well protrudes laterally into the first drift well towards the second drift well, such that the substrate has an alternating stack of p-type and n-type regions defining a RESURF structure. In some embodiments, the peripheral well protrudes laterally into the second drift well towards the first drift well, such that the substrate has an alternating stack of p-type and n-type regions defining a RESURF structure. In some embodiments, the integrated circuit further includes a spiral structure overlying both the first and second drift wells, wherein the spiral structure is conductive and has a continuous, spiral-shaped top layout. In some embodiments, the integrated circuit further includes: a diode including a PN junction defined by the peripheral well and the second drift well; and a LDMOS device on the body well and the first drift well, wherein the LDMOS device includes the gate electrode.

In some embodiments, the present application provides another integrated circuit including: a semiconductor substrate; a drift well in the semiconductor substrate, wherein the drift well has a first doping type and has a ring-shaped top layout; a high side well in the semiconductor substrate and having a second doping type opposite the first doping type, wherein the high side well overlies the drift well and is surrounded by the drift well; a switching device on the semiconductor substrate, at an indent in the drift well, wherein the drift well separates the switching device from the high side well; and a peripheral well in the semiconductor substrate and having the second doping type, wherein the peripheral well surrounds the drift well and the switching device, and wherein the peripheral well separates the switching device from the drift well. In some embodiments, the integrated circuit further includes: a second drift well in the semiconductor substrate, wherein the second drift well borders the drift well and has the first doping type; and a body well in the semiconductor substrate and having the second doping type, wherein the body well overlies the second drift well and is spaced from the peripheral well by the second drift well, and wherein the switching device is on the second drift well and the body well. In some embodiments, the integrated circuit further includes: a high side contact region overlying the high side well; and a drift contact region overlying the drift well, wherein the drift contact region extends along a periphery of the high side well in a closed path to enclose the high side well and the high side contact region, and wherein the high side contact region and the drift contact region have ring-shaped top layouts and respectively have opposite doping types. In some embodiments, the high side well has an indentation adjacent to the switching device, and wherein the high side contact region and the drift contact region conform to the indent. In some embodiments, the integrated circuit further includes: a second drift well bordering the drift well in the semiconductor substrate and having the first doping type; a body well in the semiconductor substrate and having the second doping type, wherein the body well overlies the second drift well and is completely spaced from the peripheral well by the second drift well; and a gate electrode overlying an NP junction at which the second drift well and the body well directly contact, wherein the second drift well, the body well, and the gate electrode are independent of the switching device. In some embodiments, the drift well directly contacts the peripheral well at a PN junction, and wherein the PN junction has a continuous, ring-shaped top layout. In some embodiments, the peripheral well protrudes into the drift well towards the high side well, such that the semiconductor substrate has an alternating stack of p-type and n-type regions defining a RESURF structure. In some embodiments, the integrated circuit further includes a spiral structure overlying both the drift well and the switching device, wherein the spiral structure is conductive and has a continuous, spiral-shaped top layout that completely encloses the high side well.

In some embodiments, the present application provides a method for manufacturing an integrated circuit, the method including: performing a series of doping processes into a substrate to form: a first drift well and a second drift well bordering and having a first doping type, wherein the second drift well has a ring-shaped top layout, and wherein the first drift well is at an indent in the ring-shaped top layout; a peripheral well having a second doping type opposite the first doping type, wherein the peripheral well surrounds and separates the first and second drift wells; and a body well having the second doping type, wherein the body well overlies the first drift well and is spaced from the peripheral well by the first drift well; forming an isolation structure overlying the first and second drift wells; and forming a gate electrode overlying a junction between the first drift well and the body well, and extending from the junction, along a sidewall of the isolation structure, to a top surface of the isolation structure. In some embodiments, the method further includes: depositing a conductive layer over the substrate and the isolation structure; and patterning the conductive layer to form the gate electrode, and to further form a spiral structure overlying the first and second drift wells on the top surface of the isolations structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit (IC) comprising:
    a substrate;
    a termination device well in the substrate and having a first doping type;

a switching device bordering the termination device well on the substrate, wherein the switching device comprises a pair of source/drain regions and a gate electrode between the pair of source/drain regions;

a peripheral well in the substrate and having a second doping type opposite the first doping type, wherein the peripheral well is spaced from the pair of source/drain regions of the switching device and separates and individually surrounds the switching device and the termination device well;

a high side well overlying the termination device well in the substrate and having the second doping type, wherein the high side well has a sidewall boundary directly contacting the termination device well continuously in a first closed path;

a dielectric structure sunken into the substrate;

a spiral structure overlying the switching device and the dielectric structure; and a contact region overlying the termination device well in the substrate and having the first doping type, wherein the contact region is spaced from the high side well and extends along the sidewall boundary continuously in a second closed path, and wherein the dielectric structure is continuous linearly from the contact region to the spiral structure.

2. The IC according to claim 1, further comprising:

a second contact region overlying the high side well in the substrate and having the second doping type, wherein the second contact region conforms to the sidewall boundary continuously along an entirety of the first closed path.

3. The IC according to claim 1, further comprising:

a second dielectric structure completely spaced from the dielectric structure by the contact region, wherein the second dielectric structure overlies the sidewall boundary, and borders the contact region, continuously along an entirety of the first closed path.

4. The IC according to claim 1, wherein the switching device further comprises a body well and a drift well, wherein the drift and body wells respectively have the first and second doping types in the substrate, and wherein individual sidewall boundaries respectively of the drift and body wells directly contact at a PN junction underlying the gate electrode.

5. The IC according to claim 4, wherein the peripheral well has a first sidewall boundary directly contacting the termination device well in a third closed path and further has a second sidewall boundary directly contacting the drift well in a fourth closed path, and wherein the third closed path, but not the fourth closed path, surrounds the high side well.

6. The IC according to claim 1, further comprising:

a first field plate and a second field plate overlying the dielectric structure and between which the spiral structure is arranged, wherein the dielectric structure is continuous linearly from the first field plate to the second field plate, wherein the first field plate overlies a PN junction at which individual sidewall boundaries respectively of the peripheral well and the termination device well directly contact, and wherein the second field plate borders the contact region.

7. The IC according to claim 1, wherein the peripheral well has a protrusion buried in the termination device well, wherein the protrusion has a first segment and a second segment protruding towards each other respectively on opposite sides of the high side well, and wherein the first and second segments are equidistant from the sidewall boundary.

8. An integrated circuit (IC) comprising:

a substrate;

a termination device well having a first doping type in the substrate;

a high side well overlying the termination device well and having a second doping type opposite the first doping type in the substrate, wherein the high side well has a sidewall boundary directly contacting the termination device well continuously in a first closed path;

a switching device overlying the substrate at a lateral recess in the high side well;

a peripheral well having the second doping type in the substrate, and separating and individually surrounding the switching device and the termination device well; and a pair of contact regions respectively on the termination device well and the high side well and respectively having the first and second doping types in the substrate, wherein the contact regions extend in individual second closed paths;

wherein the sidewall boundary is laterally between the contact regions continuously along an entirety of the first closed path, and wherein a separation between the contact regions is substantially the same on opposite sides of the high side well.

9. The IC according to claim 8, wherein the switching device comprises a pair of source/drain regions laterally spaced in a direction, and wherein the opposite sides are on an axis extending in parallel with the direction and overlapping with the source/drain regions.

10. The IC according to claim 8, wherein the separation has a first value and a second value respectively on the opposite sides, and wherein the first and second values are the same and extend along an axis overlapping with the switching device.

11. The IC according to claim 8, wherein the opposite sides are on a first axis, and wherein the separation between the contact regions is substantially the same on second opposite sides of the high side well that are distinct from the opposite sides and that are on a second axis orthogonal to the first axis.

12. The IC according to claim 8, further comprising:

a dielectric structure inset into a top of the substrate, wherein the dielectric structure overlies the sidewall boundary, and separates and adjoins the contact regions, continuously along an entirety of the first closed path.

13. The IC according to claim 8, wherein the separation between the contact regions is substantially the same continuously along an entirety of the first closed path.

14. The IC according to claim 8, further comprising:

a dielectric structure inset into a top of the substrate; and a first field plate and a second field plate overlying the dielectric structure and respectively bordering one of the contact regions and straddling a PN junction at which individual sidewall boundaries respectively of the termination device well and the peripheral well directly contact, wherein the dielectric structure is continuous linearly from the first field plate to the second field plate.

15. An integrated circuit (IC) comprising:

a substrate;

a termination device well having a first doping type in the substrate;

a switching device bordering the termination device well in the substrate;

a high side well overlying the termination device well in the substrate and having a second doping type opposite the first doping type;

a contact region overlying the high side well in the substrate and having the second doping type, wherein the contact region extends in a closed path along a sidewall boundary of the high side well and is localized to a periphery of the high side well; and a peripheral well having the second doping type in the substrate, and separating and individually surrounding the switching device and the termination device well, wherein the peripheral well has a protrusion buried in the termination device well, wherein the protrusion has a first segment and a second segment protruding towards each other respectively on opposite sides of the high side well, and wherein the first and second segments are separated from the contact region by substantially the same distance.

16. The IC according to claim 15, further comprising a second contact region overlying the termination device well, spaced from the high side well, and having the first doping type, wherein the contact region and the second contact region conform to the sidewall boundary continuously along an entirety of the closed path.

17. The IC according to claim 15, further comprising:

a dielectric structure inset into a top of the substrate and overlying the first and second segments of the protrusion; and a field plate overlying the dielectric structure and straddling a second sidewall boundary at which the termination device well and the peripheral well directly contact;

wherein the dielectric structure is continuous linearly from the field plate to a sidewall of the dielectric structure facing the high side well, and wherein a separation between the sidewall and the contact region is substantially the same respectively on the opposite sides of the high side well.

18. The IC according to claim 15, wherein the termination device well and the peripheral well directly contact at a second sidewall boundary that extends continuously in a second closed path around the high side well, but not around the switching device, and wherein the protrusion protrudes from the second sidewall boundary.

19. The IC according to claim 15, wherein the switching device comprises a gate electrode, as well as a body well and a drift well that are distinct from the peripheral well and that have individual sidewall boundaries directly contacting at a PN junction underlying the gate electrode, wherein the body well has a second protrusion buried in the drift well, wherein the second protrusion and a third segment of the protrusion protrude towards each other and are respectively on the opposite sides of the high side well, and wherein the third segment is closer to the contact region than the second protrusion.

20. The IC according to claim 15, wherein the first and second segments protrude along a horizontal axis towards each other, wherein the termination device well and the contact region have individual profiles extending along the horizontal axis, and wherein the individual profiles are symmetrical about a vertical axis at a center between the first and second segments.

* * * * *